(12) United States Patent
Chen et al.

(10) Patent No.: US 9,716,074 B2
(45) Date of Patent: Jul. 25, 2017

(54) WAFER BACKSIDE INTERCONNECT STRUCTURE CONNECTED TO TSVS

(71) Applicant: Taiwan Semiconductor Manufacturing Company, Ltd., Hsin-Chu (TW)

(72) Inventors: Ming-Fa Chen, Taichung (TW); Wen-Chih Chiou, Zhunan Township (TW); Shau-Lin Shue, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/323,617

(22) Filed: Jul. 3, 2014

(65) Prior Publication Data

US 2014/0312494 A1   Oct. 23, 2014

Related U.S. Application Data

(62) Division of application No. 12/832,019, filed on Jul. 7, 2010, now Pat. No. 8,791,549.

(Continued)

(51) Int. Cl.
*H01L 23/00* (2006.01)
*H01L 23/48* (2006.01)
(Continued)

(52) U.S. Cl.
CPC ........ *H01L 24/81* (2013.01); *H01L 21/76807* (2013.01); *H01L 21/76813* (2013.01); *H01L 21/76816* (2013.01); *H01L 21/76841* (2013.01); *H01L 21/76843* (2013.01); *H01L 21/76877* (2013.01); *H01L 21/76898* (2013.01); *H01L 23/481* (2013.01); *H01L 24/03* (2013.01);
(Continued)

(58) Field of Classification Search
None
See application file for complete search history.

(56) References Cited

U.S. PATENT DOCUMENTS 5,391,917 A   2/1995   Gilmour et al.
5,426,072 A   6/1995   Finnila
(Continued)

FOREIGN PATENT DOCUMENTS

CN   101752336 A   6/2010
JP   2009004730 A   1/2009
(Continued)

OTHER PUBLICATIONS

Ranganathan, N., et al.,"Integration of High Aspect Ratio Tapered Silicon Via for Through-Silicon Interconnection," Electronic Components and Technology Conference, IEEE, 2008, pp. 859-865.

*Primary Examiner* — Hoang-Quan Ho
(74) *Attorney, Agent, or Firm* — Slater Matsil, LLP

(57) ABSTRACT

An integrated circuit structure includes a semiconductor substrate having a front surface and a back surface; a conductive via passing through the semiconductor substrate; and a metal feature on the back surface of the semiconductor substrate. The metal feature includes a metal pad overlying and contacting the conductive via, and a metal line over the conductive via. The metal line includes a dual damascene structure. The integrated circuit structure further includes a bump overlying the metal line.

18 Claims, 32 Drawing Sheets

Related U.S. Application Data

(60) Provisional application No. 61/244,773, filed on Sep. 22, 2009.

(51) Int. Cl.
  *H01L 21/768* (2006.01)
  *H01L 23/31* (2006.01)

(52) U.S. Cl.
  CPC .............. *H01L 24/05* (2013.01); *H01L 24/11* (2013.01); *H01L 24/13* (2013.01); *H01L 24/14* (2013.01); *H01L 23/3114* (2013.01); *H01L 24/16* (2013.01); *H01L 2224/0401* (2013.01); *H01L 2224/05022* (2013.01); *H01L 2224/05025* (2013.01); *H01L 2224/0557* (2013.01); *H01L 2224/05546* (2013.01); *H01L 2224/05567* (2013.01); *H01L 2224/05571* (2013.01); *H01L 2224/06181* (2013.01); *H01L 2224/13007* (2013.01); *H01L 2224/13022* (2013.01); *H01L 2224/13025* (2013.01); *H01L 2224/13099* (2013.01); *H01L 2224/13144* (2013.01); *H01L 2224/13155* (2013.01); *H01L 2224/14181* (2013.01); *H01L 2224/811* (2013.01); *H01L 2224/8136* (2013.01); *H01L 2924/0002* (2013.01); *H01L 2924/00014* (2013.01); *H01L 2924/014* (2013.01); *H01L 2924/01004* (2013.01); *H01L 2924/01005* (2013.01); *H01L 2924/01006* (2013.01); *H01L 2924/01013* (2013.01); *H01L 2924/01014* (2013.01); *H01L 2924/01022* (2013.01); *H01L 2924/01023* (2013.01); *H01L 2924/01029* (2013.01); *H01L 2924/01033* (2013.01); *H01L 2924/01046* (2013.01); *H01L 2924/01073* (2013.01); *H01L 2924/01074* (2013.01); *H01L 2924/01078* (2013.01); *H01L 2924/01079* (2013.01); *H01L 2924/01082* (2013.01); *H01L 2924/01327* (2013.01); *H01L 2924/04941* (2013.01); *H01L 2924/14* (2013.01); *H01L 2924/19041* (2013.01)

(56) References Cited

U.S. PATENT DOCUMENTS

| | | |
|---|---|---|
| 5,510,298 A | 4/1996 | Redwine |
| 5,646,067 A | 7/1997 | Gaul |
| 5,767,001 A | 6/1998 | Bertagnolli et al. |
| 5,998,292 A | 12/1999 | Black et al. |
| 6,034,436 A | 3/2000 | Iwasaki |
| 6,184,060 B1 | 2/2001 | Siniaguine |
| 6,322,903 B1 | 11/2001 | Siniaguine et al. |
| 6,417,087 B1 | 7/2002 | Chittipeddi et al. |
| 6,448,168 B1 | 9/2002 | Rao et al. |
| 6,451,684 B1 | 9/2002 | Kim et al. |
| 6,465,892 B1 | 10/2002 | Suga |
| 6,472,293 B1 | 10/2002 | Suga |
| 6,498,381 B2 | 12/2002 | Halahan et al. |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,764,950 B2 | 7/2004 | Noguchi et al. |
| 6,770,528 B2 | 8/2004 | Furukawa et al. |
| 6,800,930 B2 | 10/2004 | Jackson et al. |
| 6,838,774 B2 | 1/2005 | Patti |
| 6,841,883 B1 | 1/2005 | Farnworth et al. |
| 6,873,054 B2 | 3/2005 | Miyazawa et al. |
| 6,882,030 B2 | 4/2005 | Siniaguine |
| 6,897,125 B2 | 5/2005 | Morrow et al. |
| 6,908,856 B2 | 6/2005 | Beyne et al. |
| 6,914,336 B2 | 7/2005 | Matsuki et al. |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,015,581 B2 | 3/2006 | Casey et al. |
| 7,030,481 B2 | 4/2006 | Chudzik et al. |
| 7,049,170 B2 | 5/2006 | Savastiouk et al. |
| 7,053,465 B2 | 5/2006 | Benaissa et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,186,343 B2 | 3/2007 | Rabie et al. |
| 7,186,643 B2 | 3/2007 | Ahn et al. |
| 7,193,308 B2 | 3/2007 | Matsui |
| 7,224,063 B2 | 5/2007 | Agarwala et al. |
| 7,262,495 B2 | 8/2007 | Chen et al. |
| 7,297,574 B2 | 11/2007 | Thomas et al. |
| 7,300,857 B2 | 11/2007 | Akram et al. |
| 7,335,972 B2 | 2/2008 | Chanchani |
| 7,354,798 B2 | 4/2008 | Pogge et al. |
| 7,355,273 B2 | 4/2008 | Jackson et al. |
| 7,358,180 B2 | 4/2008 | Sakai et al. |
| 7,514,775 B2 | 4/2009 | Chao et al. |
| 7,528,068 B2 | 5/2009 | Soejima et al. |
| 7,541,677 B2 | 6/2009 | Kawano |
| 7,544,605 B2 | 6/2009 | Sparks et al. |
| 7,772,081 B2 | 8/2010 | Lin et al. |
| 7,772,116 B2 | 8/2010 | Akram et al. |
| 7,800,238 B2 | 9/2010 | Pratt |
| 7,816,227 B2 | 10/2010 | Chen et al. |
| 7,855,455 B2 | 12/2010 | Purushothaman et al. |
| 7,863,187 B2 | 1/2011 | Hiatt et al. |
| 7,915,710 B2 | 3/2011 | Lee et al. |
| 7,919,835 B2 | 4/2011 | Akiyama |
| 7,968,460 B2 | 6/2011 | Kirby et al. |
| 7,969,016 B2 | 6/2011 | Chen et al. |
| 7,973,415 B2 | 7/2011 | Kawashita et al. |
| 7,999,320 B2 | 8/2011 | Botula et al. |
| 8,026,592 B2 | 9/2011 | Yoon et al. |
| 8,034,704 B2 | 10/2011 | Komai et al. |
| 8,058,708 B2 | 11/2011 | Maebashi |
| 8,097,961 B2 | 1/2012 | Tanaka et al. |
| 8,097,964 B2 | 1/2012 | West et al. |
| 8,174,124 B2 | 5/2012 | Chiu et al. |
| 8,193,092 B2 | 6/2012 | Pratt |
| 8,247,322 B2 | 8/2012 | Chang et al. |
| 8,264,077 B2 | 9/2012 | Chiou et al. |
| 8,294,261 B2 | 10/2012 | Mawatari et al. |
| 8,399,354 B2 | 3/2013 | Chen |
| 8,466,059 B2 | 6/2013 | Chang et al. |
| 8,513,119 B2 | 8/2013 | Chang et al. |
| 8,513,778 B2 | 8/2013 | Tokitoh |
| 2002/0084513 A1 | 7/2002 | Siniaguine |
| 2002/0113321 A1 | 8/2002 | Siniaguine |
| 2002/0182855 A1 | 12/2002 | Agarwala et al. |
| 2003/0148600 A1 | 8/2003 | Furukawa et al. |
| 2004/0048459 A1 | 3/2004 | Patti |
| 2004/0188822 A1 | 9/2004 | Hara |
| 2004/0245623 A1 | 12/2004 | Hara et al. |
| 2004/0248398 A1 | 12/2004 | Ahn Kie et al. |
| 2005/0009329 A1* | 1/2005 | Tanida .............. H01L 21/76898 438/667 |
| 2005/0194691 A1 | 9/2005 | Sakai et al. |
| 2005/0200025 A1 | 9/2005 | Casey et al. |
| 2005/0221601 A1 | 10/2005 | Kawano |
| 2005/0233581 A1* | 10/2005 | Soejima ........... H01L 21/76898 438/667 |
| 2006/0273465 A1 | 12/2006 | Tamura |
| 2006/0289968 A1 | 12/2006 | Sulfridge |
| 2007/0032061 A1 | 2/2007 | Farnworth et al. |
| 2007/0045780 A1* | 3/2007 | Akram .............. H01L 21/76898 257/621 |
| 2007/0049016 A1 | 3/2007 | Hiatt et al. |
| 2007/0069364 A1* | 3/2007 | Kawano ........... H01L 21/76898 257/698 |

(56) References Cited

U.S. PATENT DOCUMENTS

| | | |
|---|---|---|
| 2007/0080457 A1* | 4/2007 | Tanida .................. H01L 23/481 257/739 |
| 2008/0054444 A1 | 3/2008 | Tuttle |
| 2008/0136023 A1 | 6/2008 | Komai et al. |
| 2008/0211106 A1 | 9/2008 | Chang et al. |
| 2009/0014843 A1 | 1/2009 | Kawashita et al. |
| 2009/0032960 A1 | 2/2009 | Pratt |
| 2009/0032966 A1 | 2/2009 | Lee et al. |
| 2009/0051012 A1* | 2/2009 | Maebashi ......... H01L 21/76898 257/621 |
| 2009/0057909 A1 | 3/2009 | Strothmann |
| 2009/0072397 A1* | 3/2009 | Loo ...................... H01L 23/525 257/738 |
| 2009/0149023 A1 | 6/2009 | Koyanagi |
| 2009/0152602 A1 | 6/2009 | Akiyama |
| 2009/0250739 A1 | 10/2009 | Johnson et al. |
| 2009/0269905 A1 | 10/2009 | Chen et al. |
| 2009/0283898 A1 | 11/2009 | Janzen et al. |
| 2009/0315184 A1 | 12/2009 | Tokitoh |
| 2010/0013060 A1 | 1/2010 | Lamy et al. |
| 2010/0032811 A1 | 2/2010 | Ding et al. |
| 2010/0038800 A1 | 2/2010 | Yoon et al. |
| 2010/0078770 A1 | 4/2010 | Purushothaman et al. |
| 2010/0090318 A1* | 4/2010 | Hsu .................. H01L 21/76898 257/621 |
| 2010/0105169 A1* | 4/2010 | Lee .................. H01L 21/76898 438/107 |
| 2010/0127394 A1 | 5/2010 | Ramiah |
| 2010/0140752 A1* | 6/2010 | Marimuthu ......... H01L 23/3121 257/621 |
| 2010/0140805 A1 | 6/2010 | Chang et al. |
| 2010/0164117 A1 | 7/2010 | Chen |
| 2010/0171197 A1 | 7/2010 | Chang et al. |
| 2010/0171226 A1 | 7/2010 | West et al. |
| 2010/0176494 A1 | 7/2010 | Chen |
| 2010/0178761 A1 | 7/2010 | Chen et al. |
| 2010/0330798 A1 | 12/2010 | Huang et al. |
| 2011/0049706 A1 | 3/2011 | Huang et al. |
| 2011/0068466 A1 | 3/2011 | Chen et al. |
| 2011/0165776 A1 | 7/2011 | Hsu et al. |
| 2011/0186990 A1 | 8/2011 | Mawatari et al. |
| 2011/0233785 A1 | 9/2011 | Koester et al. |
| 2011/0241217 A1 | 10/2011 | Chang et al. |
| 2011/0318917 A1 | 12/2011 | Yoon et al. |
| 2013/0001799 A1 | 1/2013 | Chang et al. |
| 2013/0075898 A1 | 3/2013 | Pratt |
| 2013/0299992 A1 | 11/2013 | Chang et al. |

FOREIGN PATENT DOCUMENTS

| | | |
|---|---|---|
| JP | 2009147218 A | 7/2009 |
| KR | 1020060054688 A | 5/2006 |
| KR | 1020060054689 A | 5/2006 |
| KR | 1020060054690 A | 5/2006 |
| KR | 20080101635 A | 11/2008 |
| TW | 531892 B | 5/2003 |
| TW | 200737551 | 10/2007 |
| TW | 200910557 | 3/2009 |
| TW | 201036106 A | 10/2010 |

* cited by examiner

WAFER BACKSIDE INTERCONNECT STRUCTURE CONNECTED TO TSVS

This application is a divisional of U.S. Ser. No. 12/832,019, filed Jul. 7, 2010 which claims the benefit of U.S. Provisional Application No. 61/244,773 filed on Sep. 22, 2009, entitled "Wafer Backside Interconnect Structure Connected to TSVs," which applications are hereby incorporated herein by reference.

TECHNICAL FIELD

This disclosure relates generally to integrated circuit structures, and more particularly to interconnect structures formed on the backside of wafers and connected to through-substrate vias.

BACKGROUND

The semiconductor industry has experienced continuous rapid growth due to constant improvements in the integration density of various electronic components (i.e., transistors, diodes, resistors, capacitors, etc.). For the most part, this improvement in integration density has come from repeated reductions in minimum feature size, allowing more components to be integrated into a given chip area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limitations to the density that can be achieved in two dimensions. One of these limitations is the minimum size needed to make these components. Also, when more devices are put into one chip, more complex designs are required.

An additional limitation comes from the significant increase in the number and lengths of interconnections between devices as the number of devices increases. When the number and the lengths of interconnections increase, both circuit RC delay and power consumption increase.

Among the efforts for resolving the above-discussed limitations, three-dimensional integrated circuit (3D IC) and stacked dies are commonly used. Through-substrate vias (TSVs) are thus used in 3D ICs and stacked dies for connecting dies. In this case, TSVs are often used to connect the integrated circuits on a die to the backside of the die. In addition, TSVs are also used to provide short grounding paths for grounding the integrated circuits through the backside of the die, which may be covered by a grounded metallic film.

Since the bonding of chips comprising TSVs requires relatively large pitch between TSVs, the location of the TSVs is restricted and the distance between the TSVs needs to be big enough to allow room for, for example, solder balls. In addition, with the existing methods for forming wafer backside structures, it is impossible to route the electrical connection of TSVs to locations far away from the respective TSVs.

SUMMARY

In accordance with one aspect of the embodiment, an integrated circuit structure includes a semiconductor substrate having a front surface and a back surface; a conductive via passing through the semiconductor substrate; and a metal feature on the back surface of the semiconductor substrate. The metal feature includes a metal pad overlying and contacting the conductive via, and a metal line over the conductive via. The metal line includes a dual damascene structure. The integrated circuit structure further includes a bump overlying the metal line.

Other embodiments are also disclosed.

BRIEF DESCRIPTION OF THE DRAWINGS

For a more complete understanding of the disclosure, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

A novel backside connection structure connected to through-substrate vias (TSVs) and the method of forming the same are provided. The intermediate stages of manufacturing an embodiment are illustrated. The variations of the embodiment are discussed. Throughout the various views and illustrative embodiments, like reference numbers are used to designate like elements.

Figure 1:
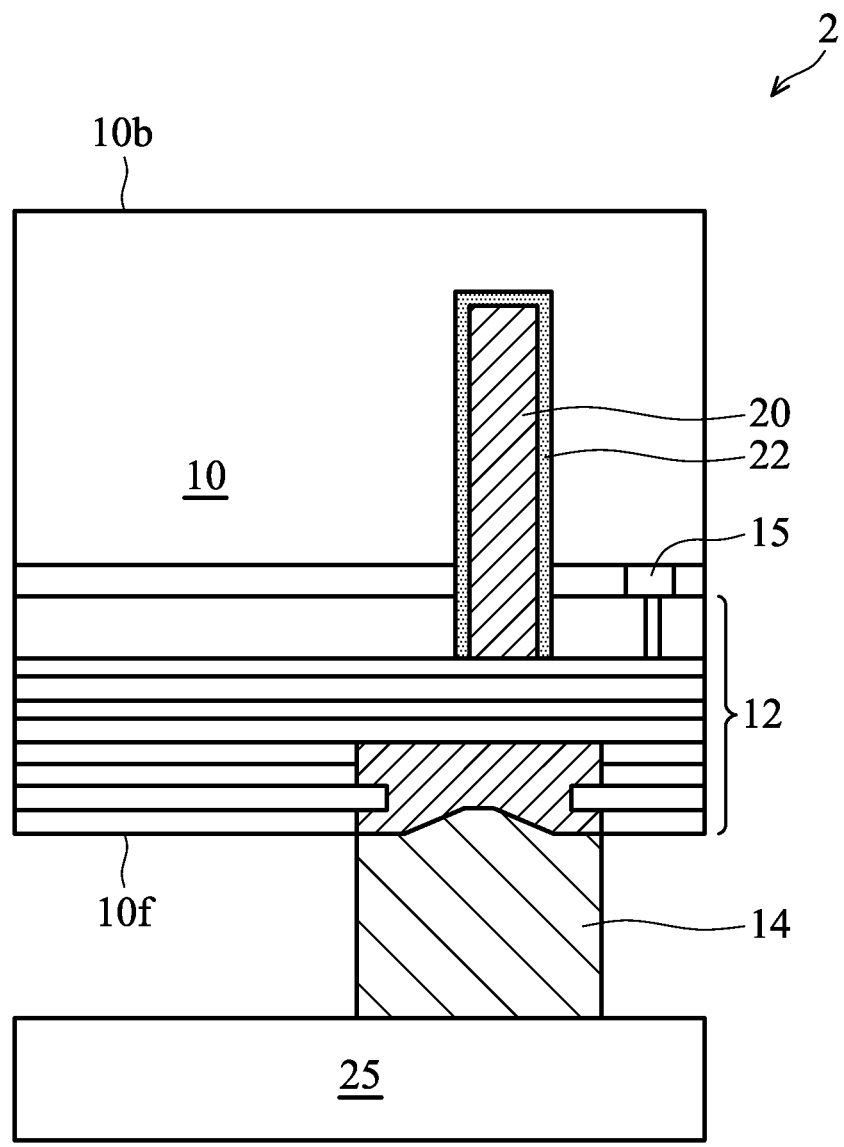
FIGS. 1 through 12B illustrate cross-sectional views of intermediate stages in the manufacturing of a backside interconnect structure in accordance with an embodiment, in which the back surface of a substrate and a through-substrate via (TSV) are recessed.

Referring to FIG. 1, chip 2, which includes substrate 10 and integrated circuits (not shown) therein, is provided. Chip 2 may be a portion of a wafer. Substrate 10 may be a semiconductor substrate, such as a bulk silicon substrate, although it may include other semiconductor materials such as group III, group IV, and/or group V elements. Active semiconductor devices such as transistors (symbolized by block 15) may be formed on front side 10$f$ of substrate 10. Throughout the description, the term "backside" refers to the side of substrate 10 opposite the side having the active semiconductor devices. Interconnect structure 12, which includes metal lines and vias (not shown) formed therein, is formed on front side 10$f$ of substrate 10 and connected to the active semiconductor devices. The metal lines and vias may be formed of copper or copper alloys, and may be formed using the well-known damascene processes. Interconnect structure 12 may include commonly known inter-layer dielectric (ILD) and inter-metal dielectrics (IMDs). Bond pad 14 is formed on the front side 10$f$ of substrate 10.

TSV 20 is formed in substrate 10, and extends from the front side 10$f$ into substrate 10. In an embodiment, as shown in FIG. 1, TSV 20 is formed using a via-first approach, and is formed before the formation of interconnect structure 12. Accordingly, TSV 20 only extends to the ILD that is used to cover the active devices, but not into the IMD layers in interconnect structure 12. In alternative embodiments, TSV 20 is formed using a via-last approach, and is formed after the formation of interconnect structure 12. Accordingly, TSV 20 penetrates through both substrate 10 and interconnect structure 12. Isolation layer 22 is formed on the sidewalls and an end of TSV 20, and electrically insulates TSV 20 from substrate 10. Isolation layer 22 may be formed of commonly used dielectric materials such as silicon nitride, silicon oxide (for example, tetra-ethyl-ortho-silicate (TEOS) oxide), and the like. Chip 2 and the corresponding wafer is adhered to carrier 25.

Figure 2:
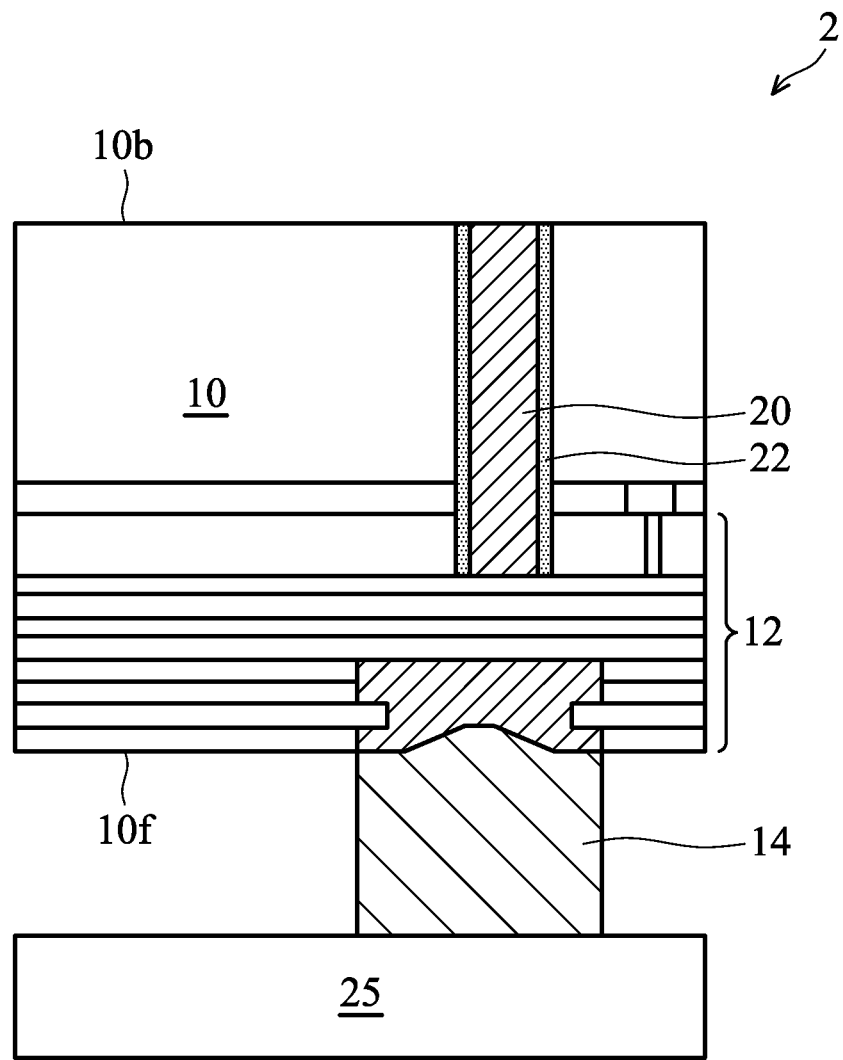
Figure 3:
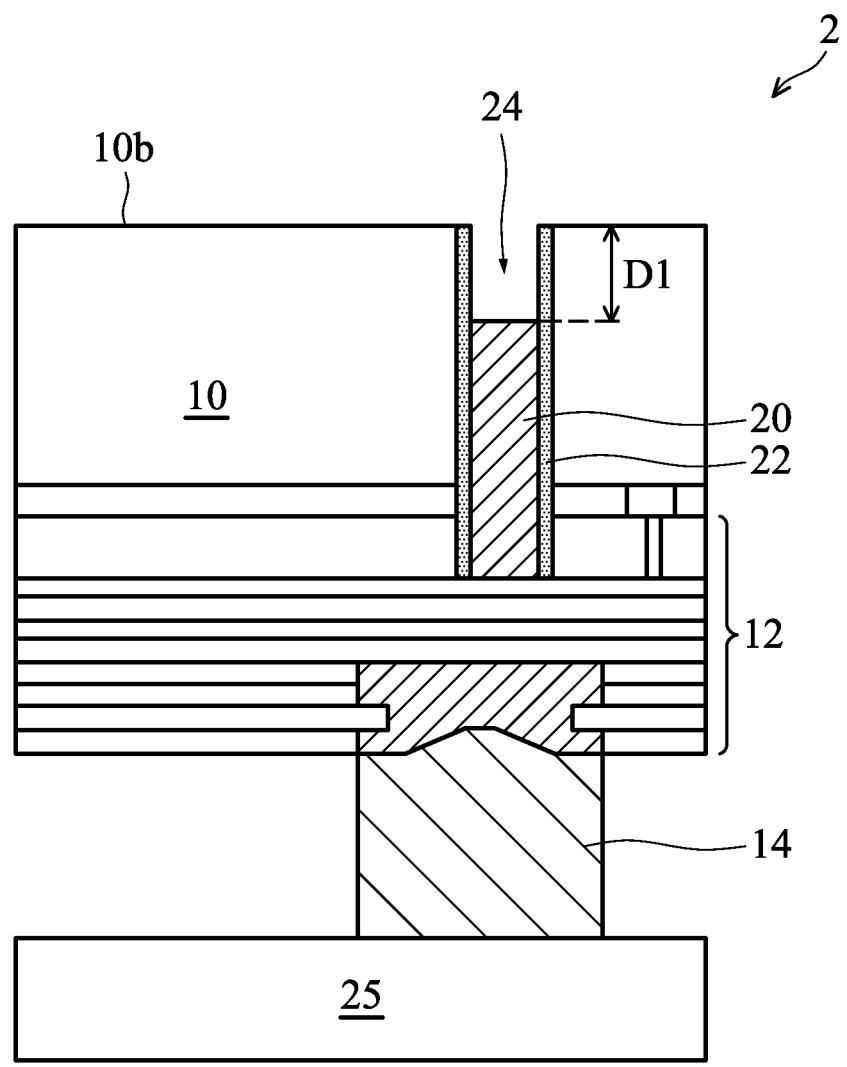

Referring to FIG. 2, a backside grinding is performed so that TSV 20 is exposed through the back surface 10b of substrate 10. The backside grinding may be performed using TSV 20 as a stop layer. Next, as shown in FIG. 3, TSV 20 is recessed, so that it's top surface is lower than the back surface 10b of substrate 10. The recess depth D1 may be greater than about 0.5 μm, and may be 3 μm in an exemplary embodiment. As a result of the recessing, opening 24 is formed.

Figure 4:
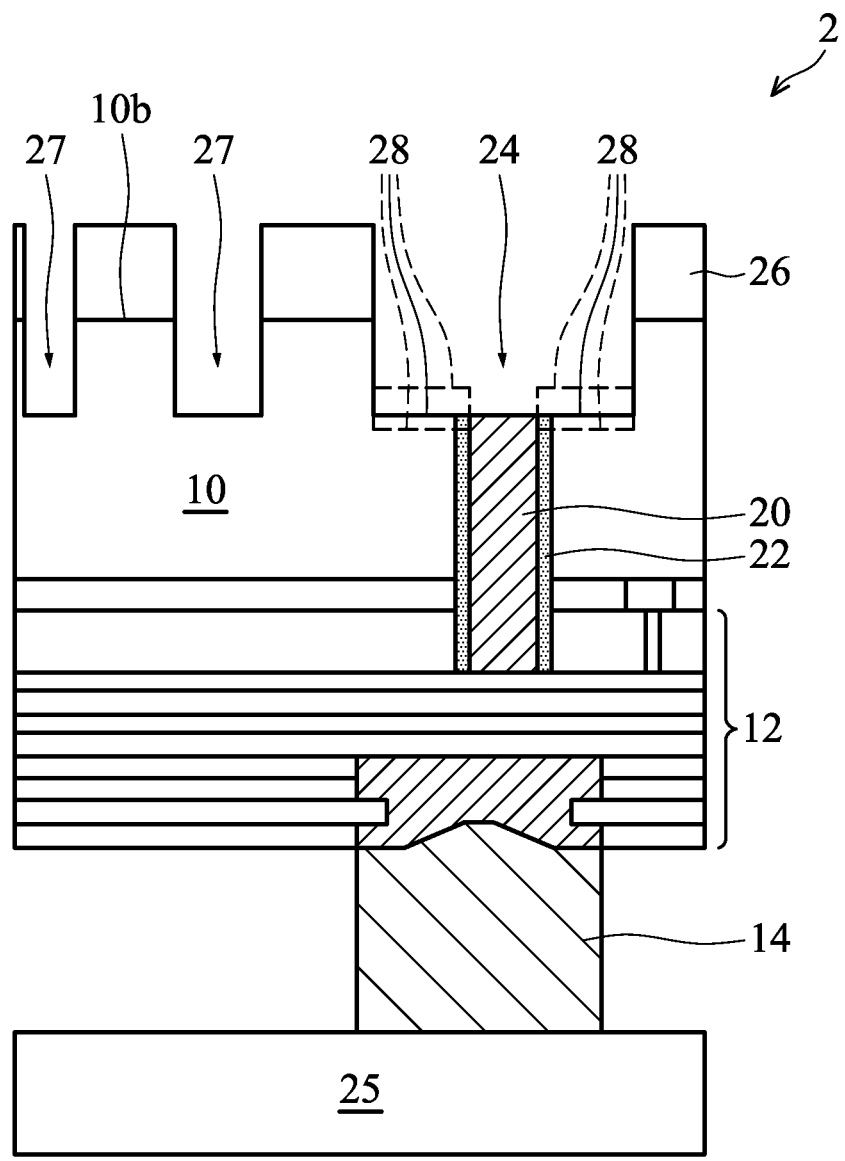

FIG. 4 illustrates the recessing of substrate 10, which is performed using photo resist 26 as a mask. As a result of the recessing, the horizontal dimension of opening 24 is increased to greater than that of TSV 20. Although, FIG. 3 illustrates that in opening 24 lower portion 28 of back surface 10b is level with the exposed end of TSV 20. Alternatively, lower portion 28 may also be higher than or lower than the exposed end of TSV 20, as also illustrated by dotted lines. At the same time opening 24 is formed, (trench) openings 27 are also formed.

Figure 5:
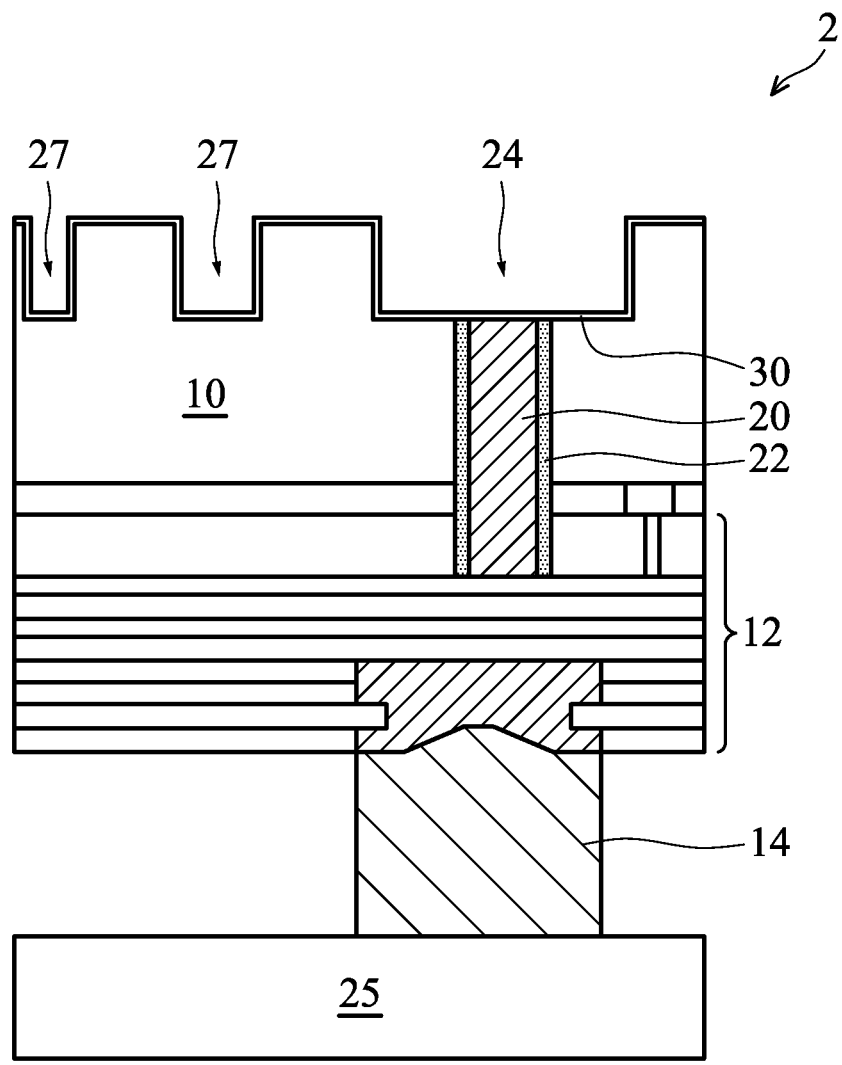
Figure 6:
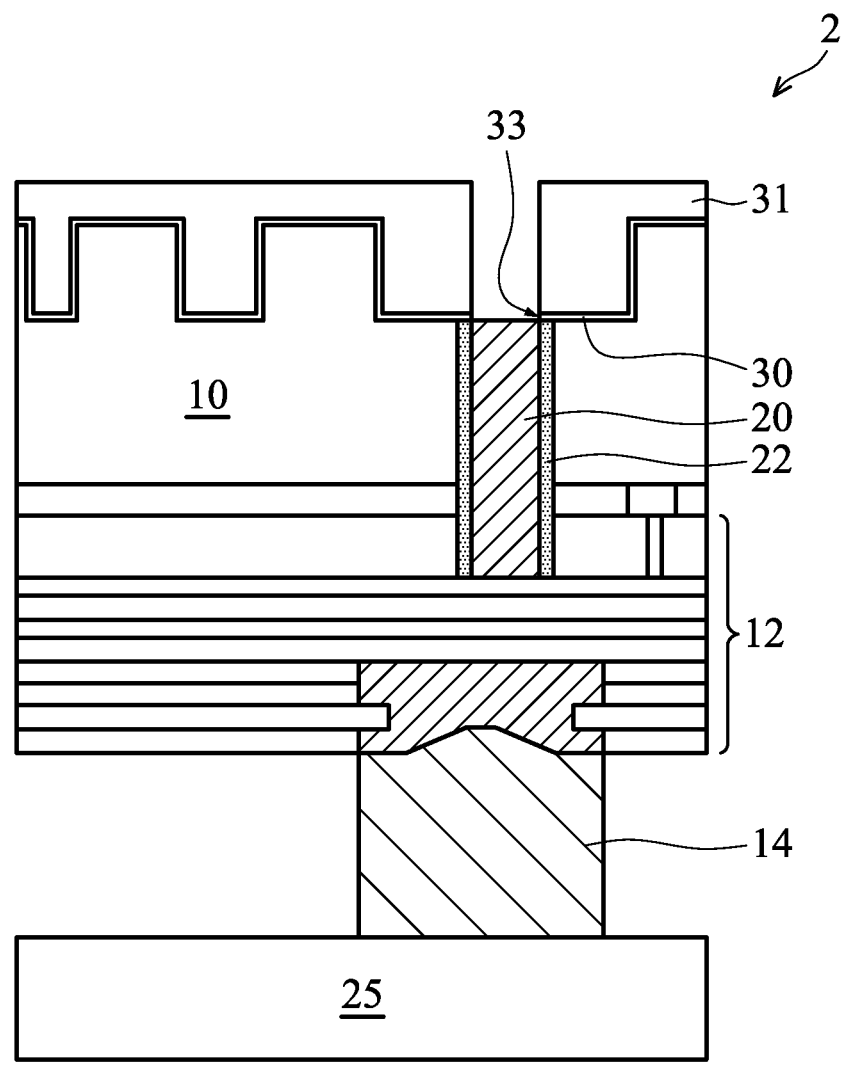

Referring to FIG. 5, dielectric isolation layer 30 is deposited. The deposition methods include low-temperature chemical vapor deposition (LTCVD), although other commonly used methods may also be used. In an exemplary embodiment, dielectric isolation layer 30 comprises silicon nitride ($SiN_x$), and may have a thickness of a several hundred angstroms. Next, as shown in FIG. 6, a portion of the dielectric isolation layer 30 overlying the end of the TSV 20 is exposed in a via opening 33 by applying photo resist 31 and performing photolithography processes, so that the subsequently formed bump may be electrically connected to TSV 20.

Figure 7:
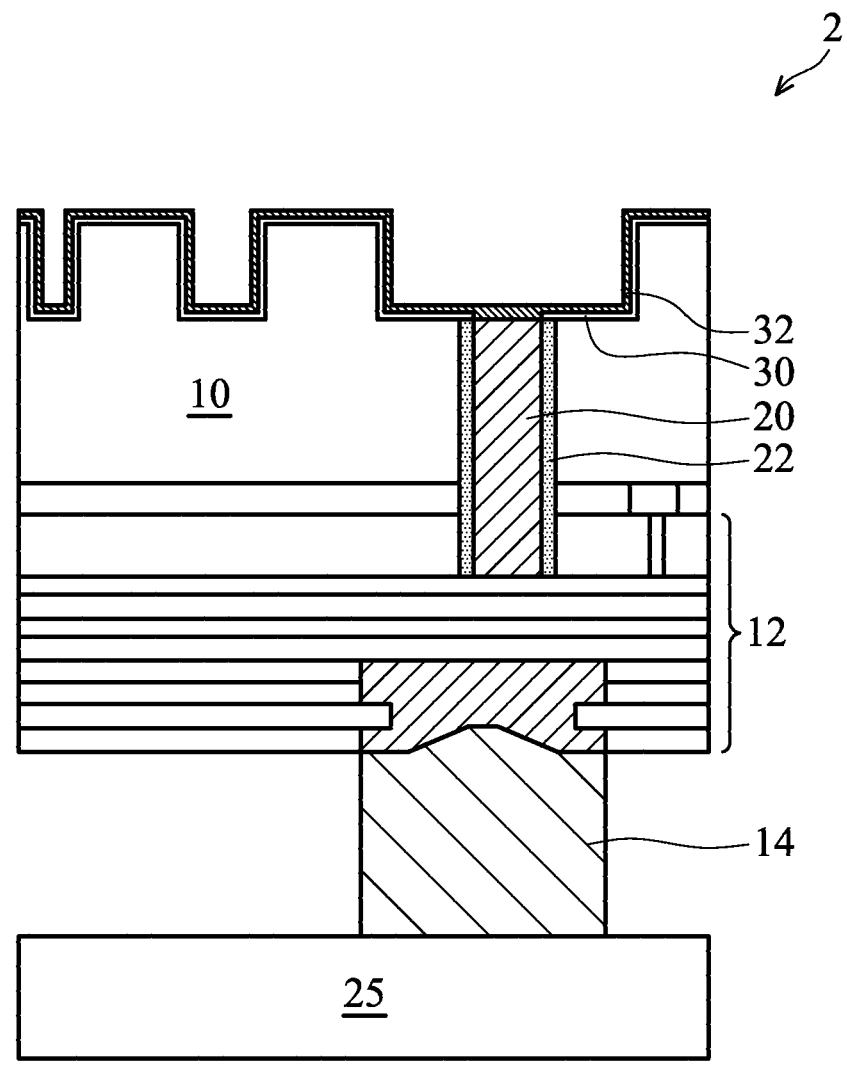
Figure 8:
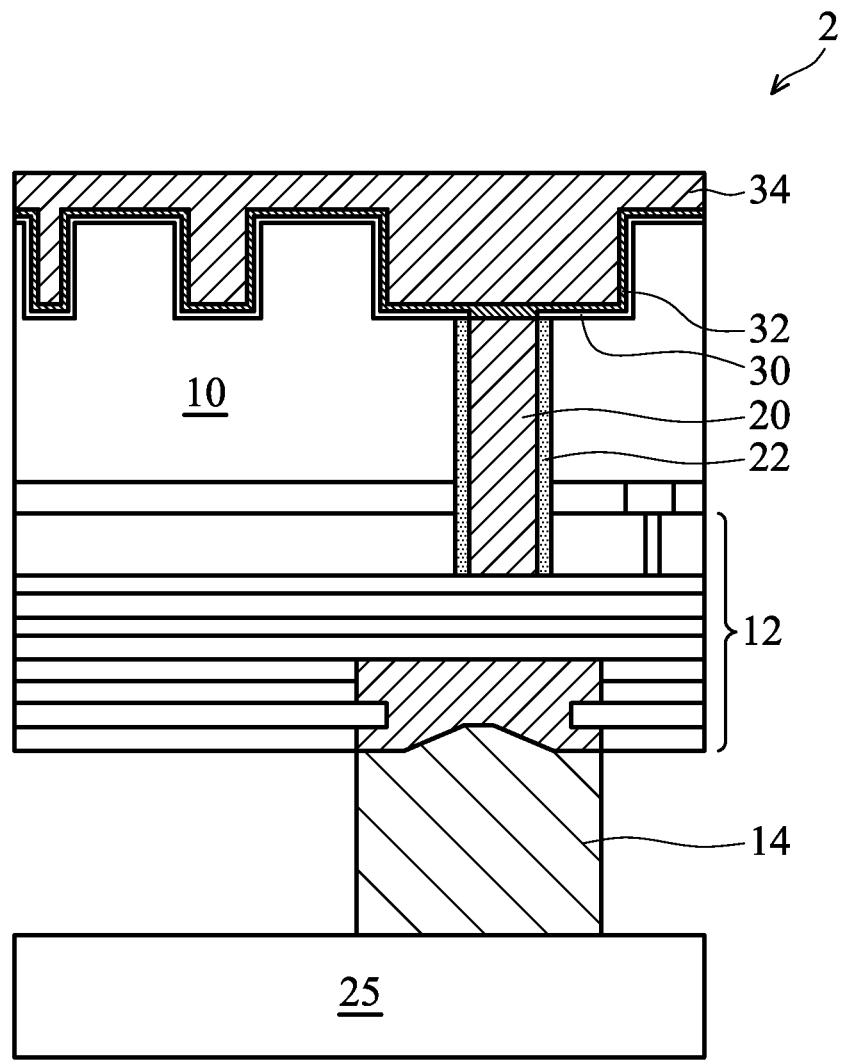
Figure 9:
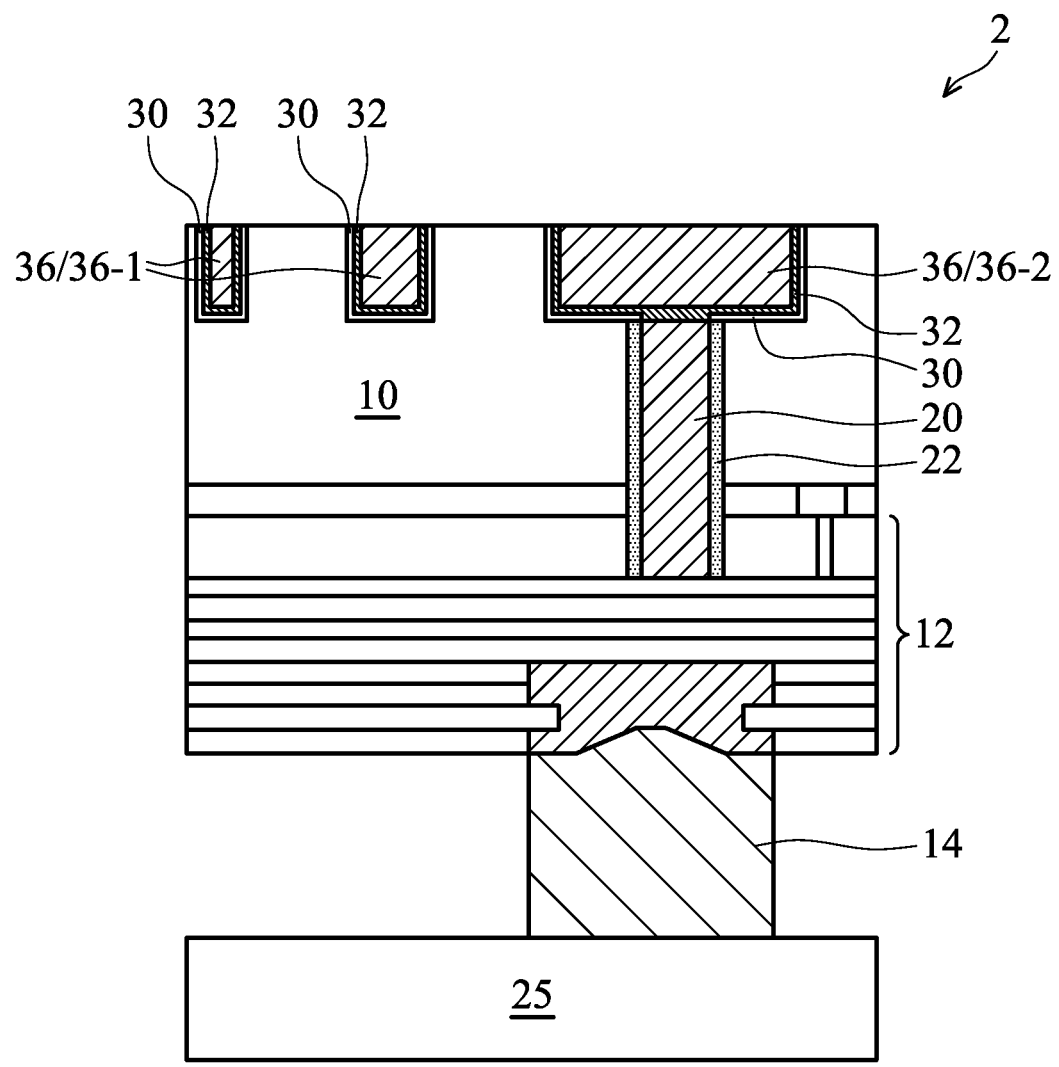

FIGS. 7 through 9 illustrate the formation of redistribution lines and pads. Referring to FIG. 7, conductive barrier layer 32, which may comprise titanium, titanium nitride, tantalum, tantalum nitride, or the like, is formed, for example, by sputtering. Copper 34 is then plated, as shown in FIG. 8. The thickness of copper 34 depends on depth D1 (FIG. 3). A chemical mechanical polish (CMP) is then performed to form metal features 36 (denoted as 36-1 and 36-2), and the resulting structure is shown in FIG. 9. Metal features 36 may include metal lines 36-1, which may actually be connected to other TSVs (not shown). Accordingly, metal lines 36-1 are used as redistribution lines. Metal feature 36-2 may be a metal pad or a metal line. The metal pad may have dimensions (viewed from top) greater than that of TSV 20, and the metal pad may extend beyond the edges of TSV 20 in all horizontal directions. Accordingly, metal pad 36-2 and TSV 20 have a reliable connection with a large interface area, and hence a small contact resistance. Further, the accuracy requirement for aligning metal pad 36-2 to TSV 20 is relaxed.

Figure 10:
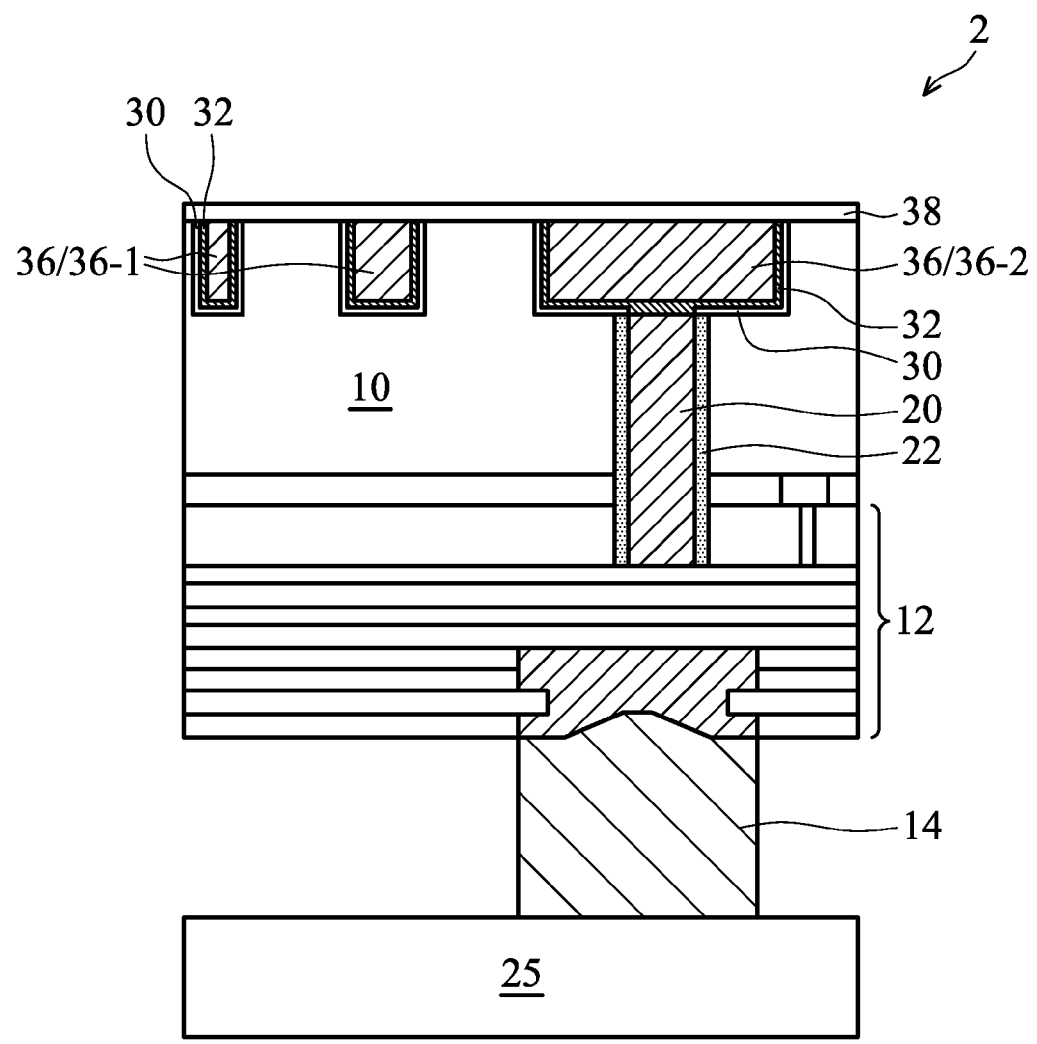
Figure 11:
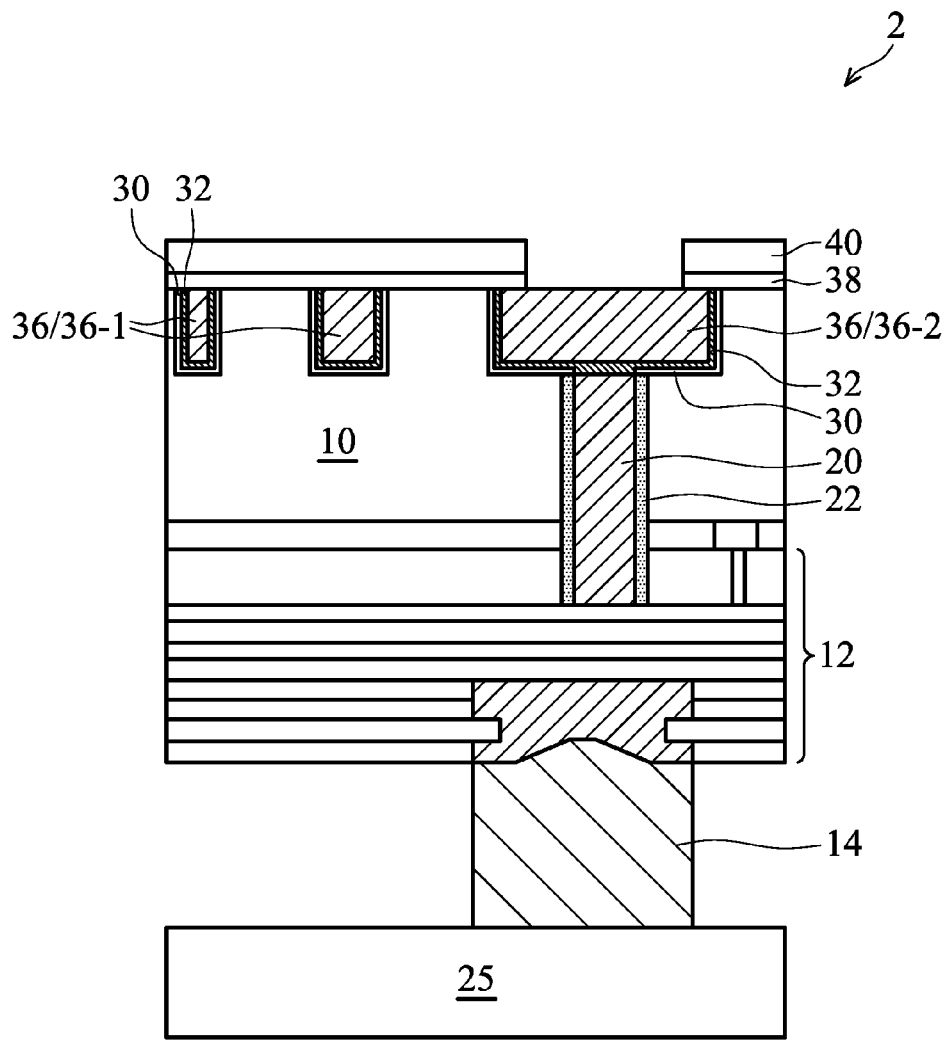
Figure 12A:
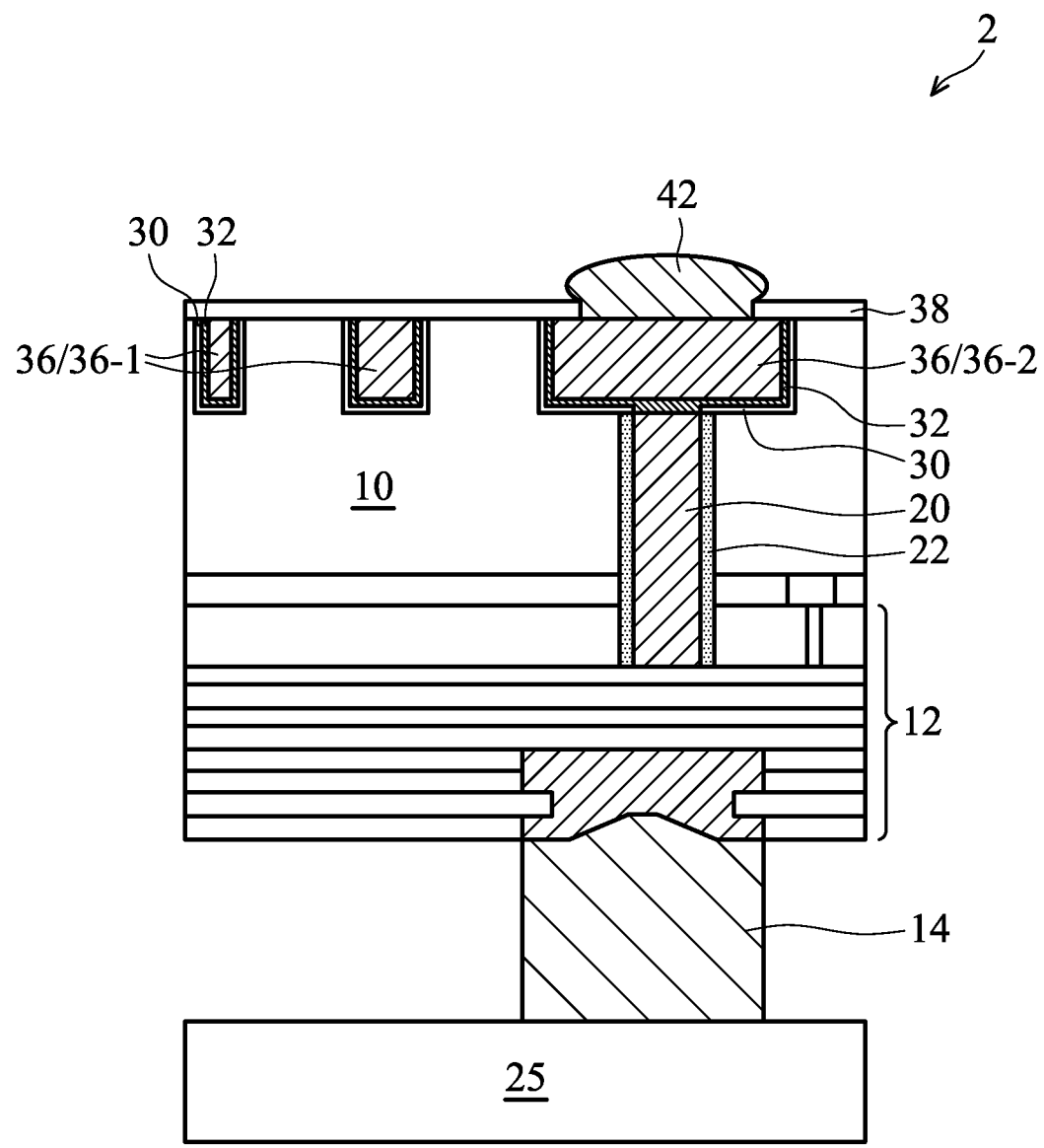

FIGS. 10-12A illustrate the formation of bump 42. Referring to FIG. 10, dielectric layer 38 is blanket deposited. In an exemplary embodiment, dielectric layer 38 comprises silicon nitride ($SiN_x$), and may have a thickness, for example, of about 0.2 μm. Next, as shown in FIG. 11, with photo resist 40, an opening is formed in dielectric layer 38 so that metal pad 36-2 is exposed. FIG. 12A illustrates the formation of bump 42, which is also referred to as a micro-bump (U-bump) since is may have a horizontal dimension (length or width) of less than about 30 μm. The formation methods of bump 42 include electrical chemical plating (ECP), electroless plating, and immersion. The resulting bump 42 may have an electroless nickel immersion gold (ENIG) structure, a nickel electroless palladium immersion gold (ENEPIG) structure, or a nick palladium structure. It is realized that although FIG. 12A illustrates that bump 42 is directly over metal pad 36-2, bump 42 may also be not directly over metal pad 36-2, and may actually be connected to metal pad 36-2 through a redistribution line similar to metal lines 36-1, which redistribution lines are formed simultaneously with the formation of metal features 36.

Figure 12B:
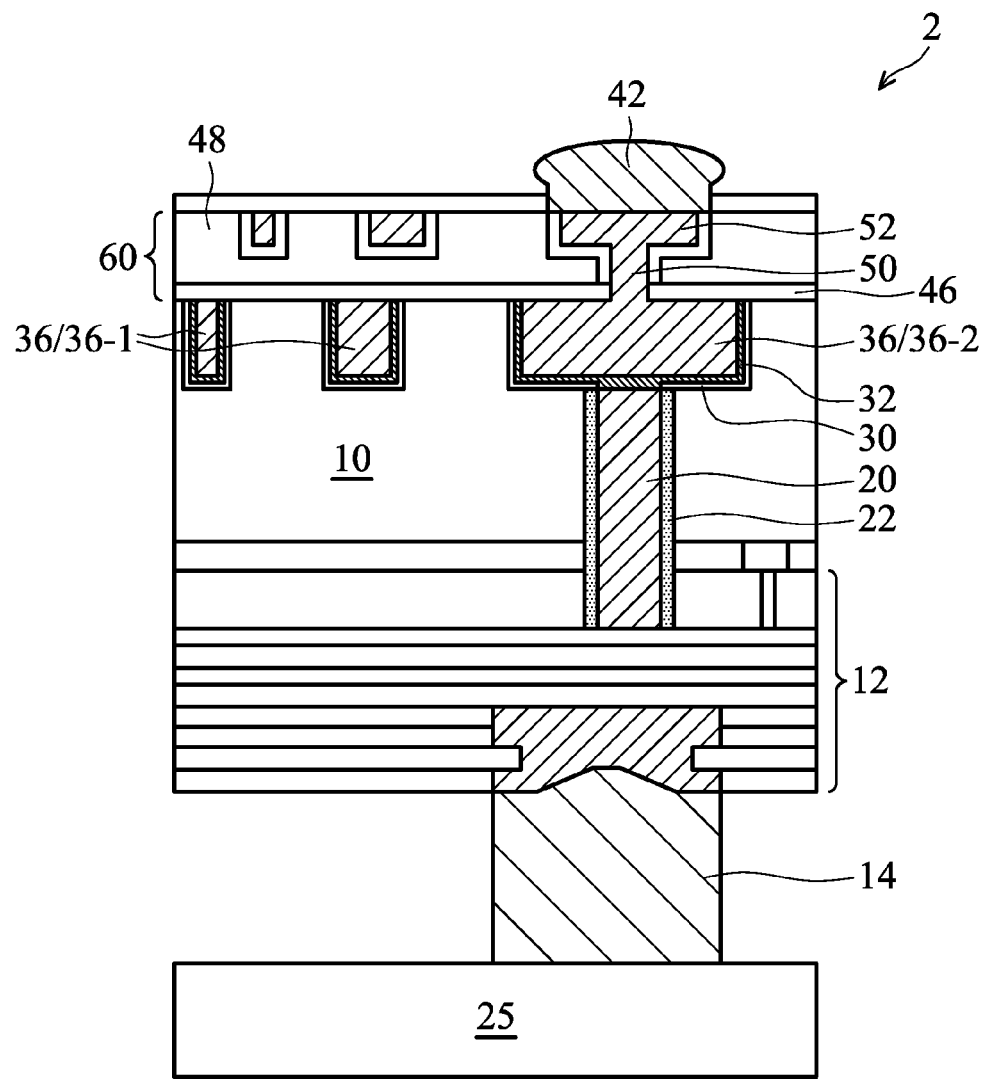

FIG. 12B illustrates an alternative embodiment. Instead of forming bump 42 directly on metal pad 36-2, additional layers of redistribution lines may be formed. For example, an additional layer 60 including etch stop layer 46, dielectric layer 48, via 50, and metal line 52 may be inserted between metal pad 36-2 and bump 42. If needed, more layers similar to layer 60 may be stacked on layer 60 to increase the routability of the backside interconnect structure. The formation details of layer 60 may be essentially the same as shown in FIGS. 18-21, as will be discussed in subsequent paragraphs.

Figure 13:
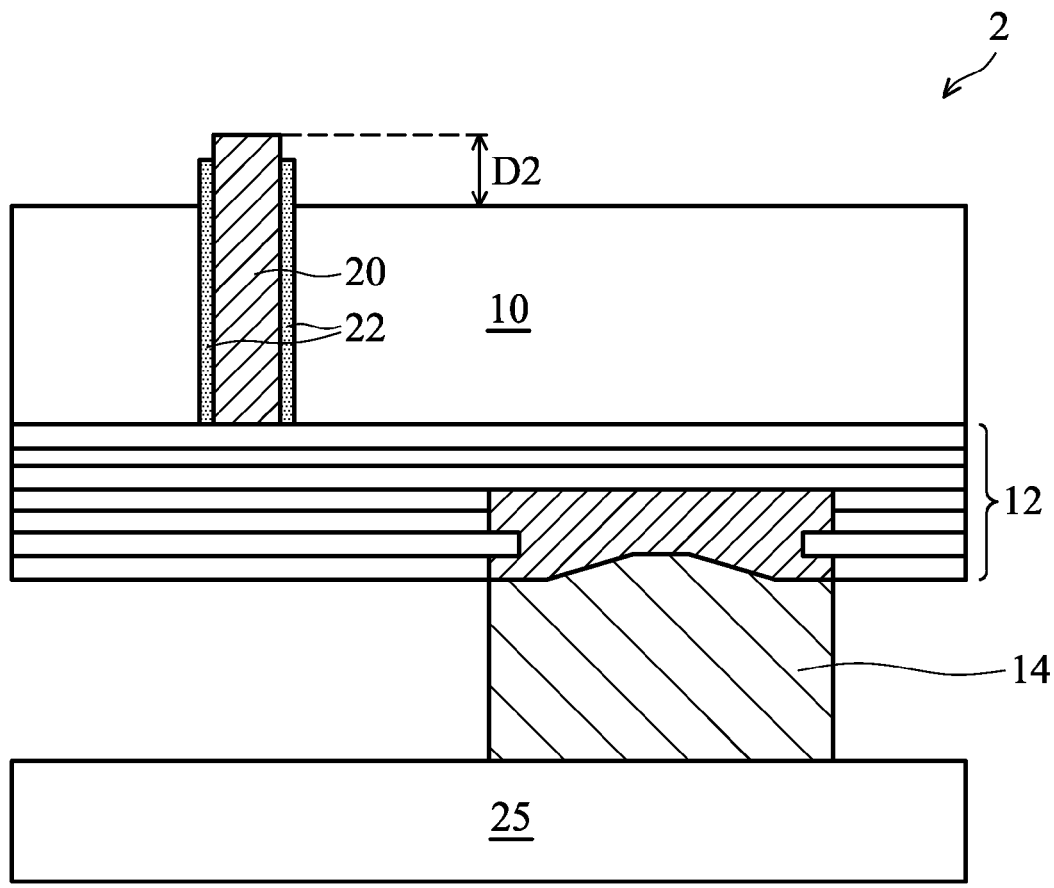
FIGS. 13 through 23B illustrate cross-sectional views of intermediate stages in the manufacturing of a backside interconnect structure in accordance with another embodiment, in which the back surface of a substrate is recessed.

FIGS. 13 through 23B illustrate an alternative embodiment. The initial steps of this embodiment are the same as illustrated in FIGS. 1 and 2. Next. Referring to FIG. 13, substrate 10 is etched back from the backside, so that TSV 20 protrudes out of the back surface of substrate 10. In an exemplary embodiment, the etch back depth D2 is greater than about 0.5 μm, and may be about 1 μm. Isolation layer 22 may also be etched back from the top surface of TSV 20, for example, to about 0.5 μm lower than the top surface of TSV 20. Accordingly, portions of sidewalls of TSV 20 are exposed.

Figure 14:
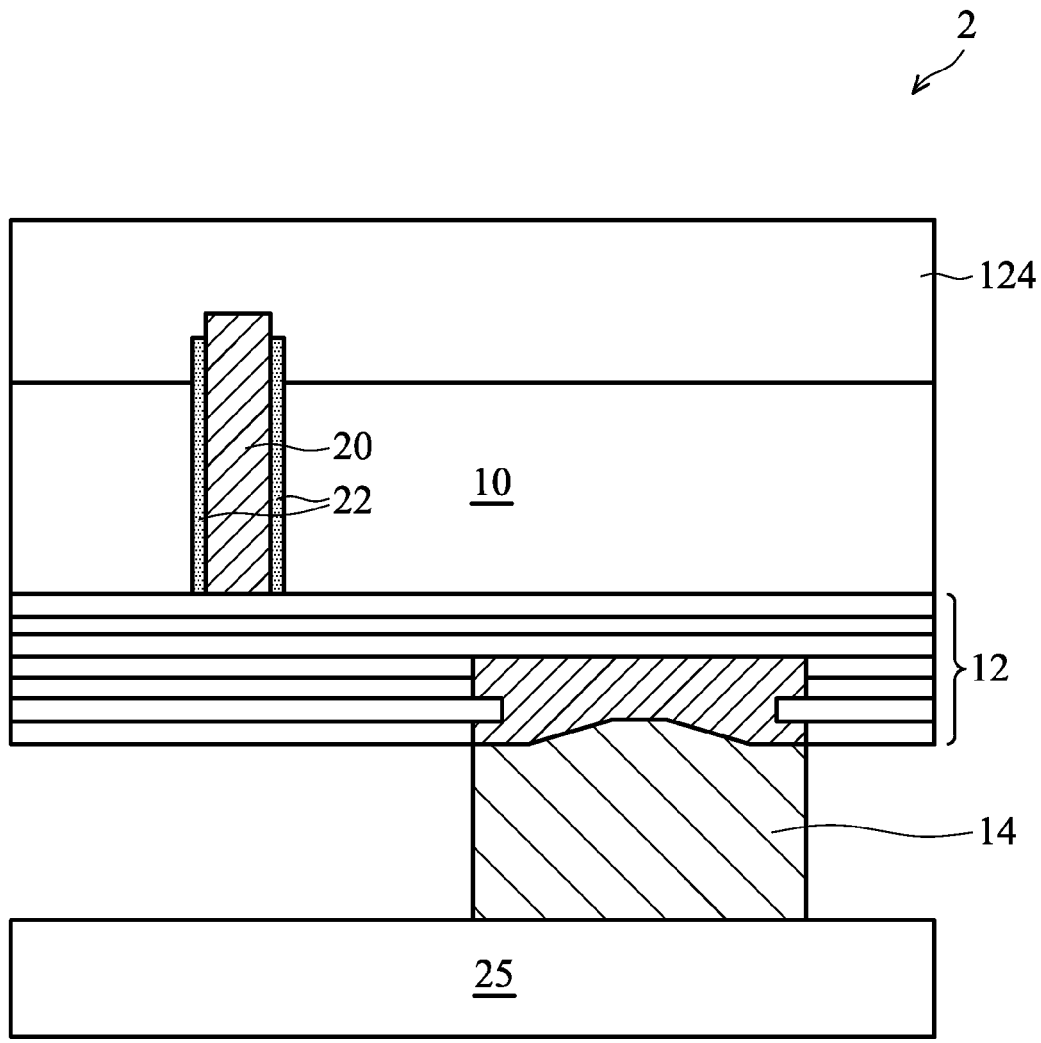

Referring to FIG. 14, dielectric layer 124 is formed on the back surface of substrate 10 and covers TSV 20. In an embodiment, dielectric layer 124 is formed of polyimide, and may have a thickness greater than about 2 μm, with an exemplary thickness equal to about 3 μm. In alternative embodiments, other dielectric materials may be used.

Figure 15:
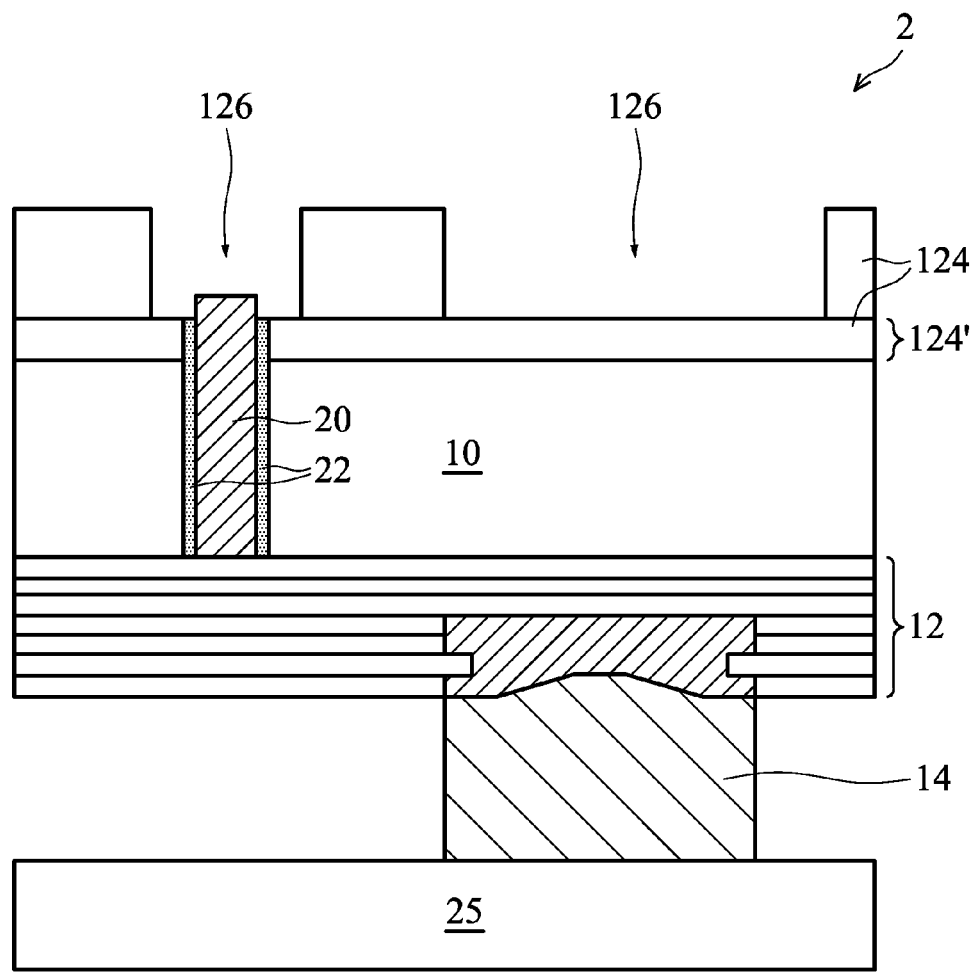
Figure 16:
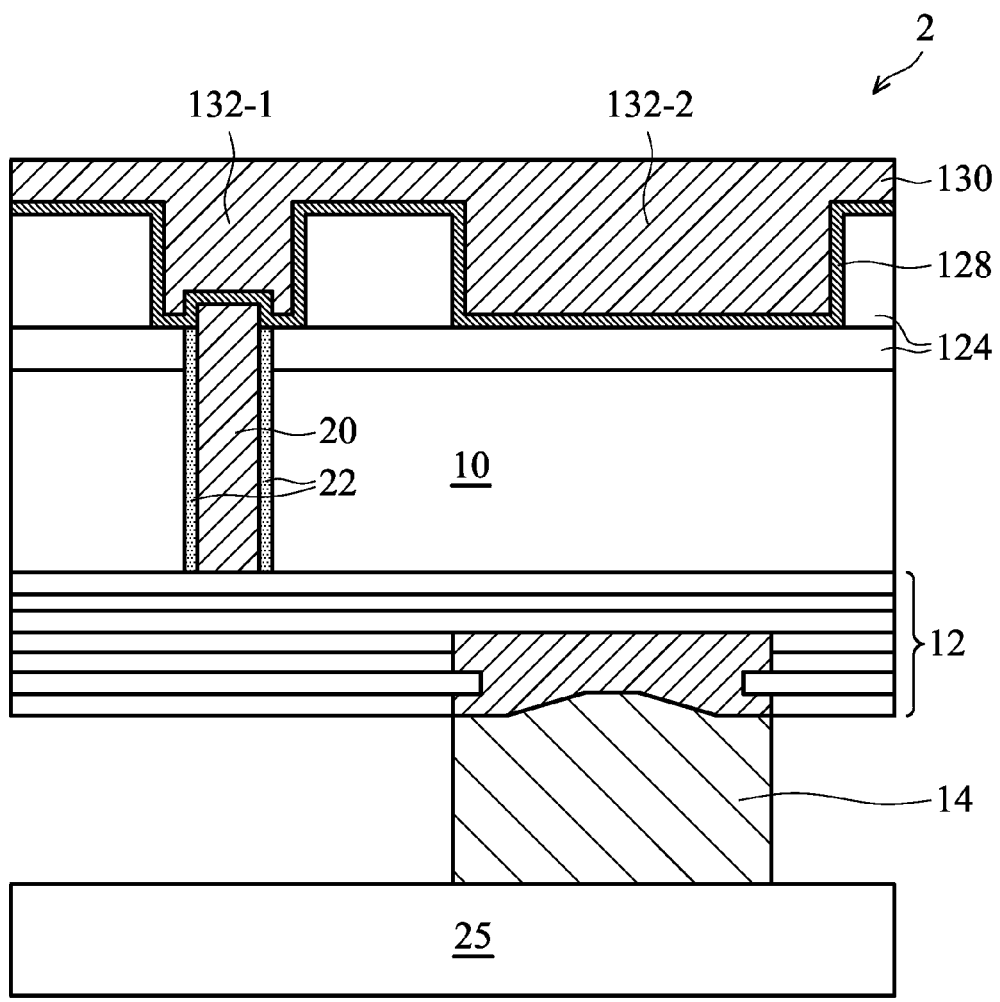
Figure 17:
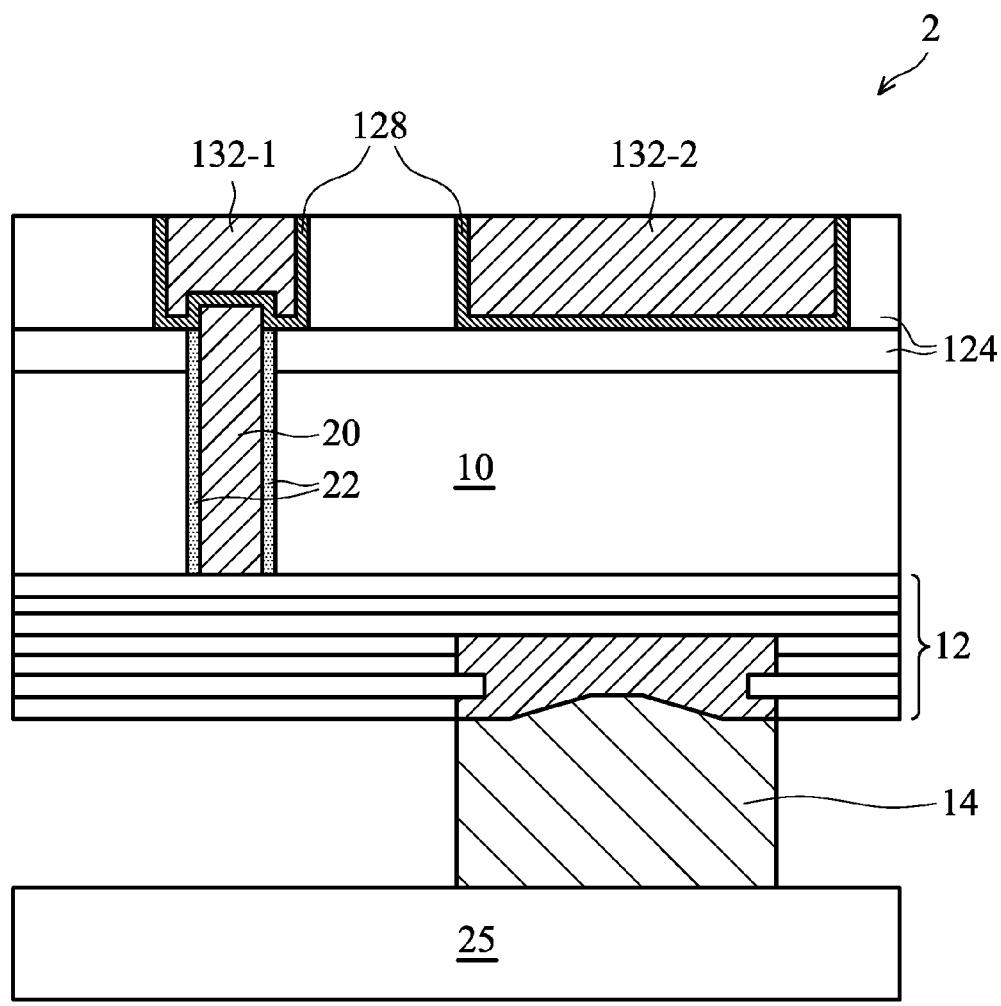

FIGS. 15 through 17 illustrate the formation of metal lines. Referring to FIG. 15, openings 126 are formed by etching dielectric layer 124, for example, with the help of a photo resist (not shown). In an embodiment, the opening formation process is controlled, for example, using a time mode, so that TSV 20 is exposed through one of openings 126, while a bottom portion of dielectric layer 124 (denoted as layer 124') remains to separate openings 126 from substrate 10.

Referring to FIG. 16, a pre-clean is performed, and conductive barrier layer 128 is deposited, for example, by sputtering. Conductive barrier layer 128 may comprise titanium, tantalum, or the like. Metallic material 130 is then plated to a level higher than the top surface of dielectric layer 124. Metallic material 130 may include copper, although other metals such as aluminum, tungsten, or the like, may also be used. A CMP is then performed, as shown in FIG. 17, and hence metal lines/pads 132 (denoted as 132-1 and 132-2) are formed. Metal line 132-2 may be electrically connected to one of the TSVs in the chip. Accordingly, metal line 132-2 may be used as a redistribution line. Metal feature 132-1 may be a metal pad or a metal trace. The metal pad may have dimensions (viewed from top) greater than that of TSV 20, wherein in the top view, metal pad 132-1 may extend beyond the edges of TSV 20 in all lateral directions.

Figure 18:
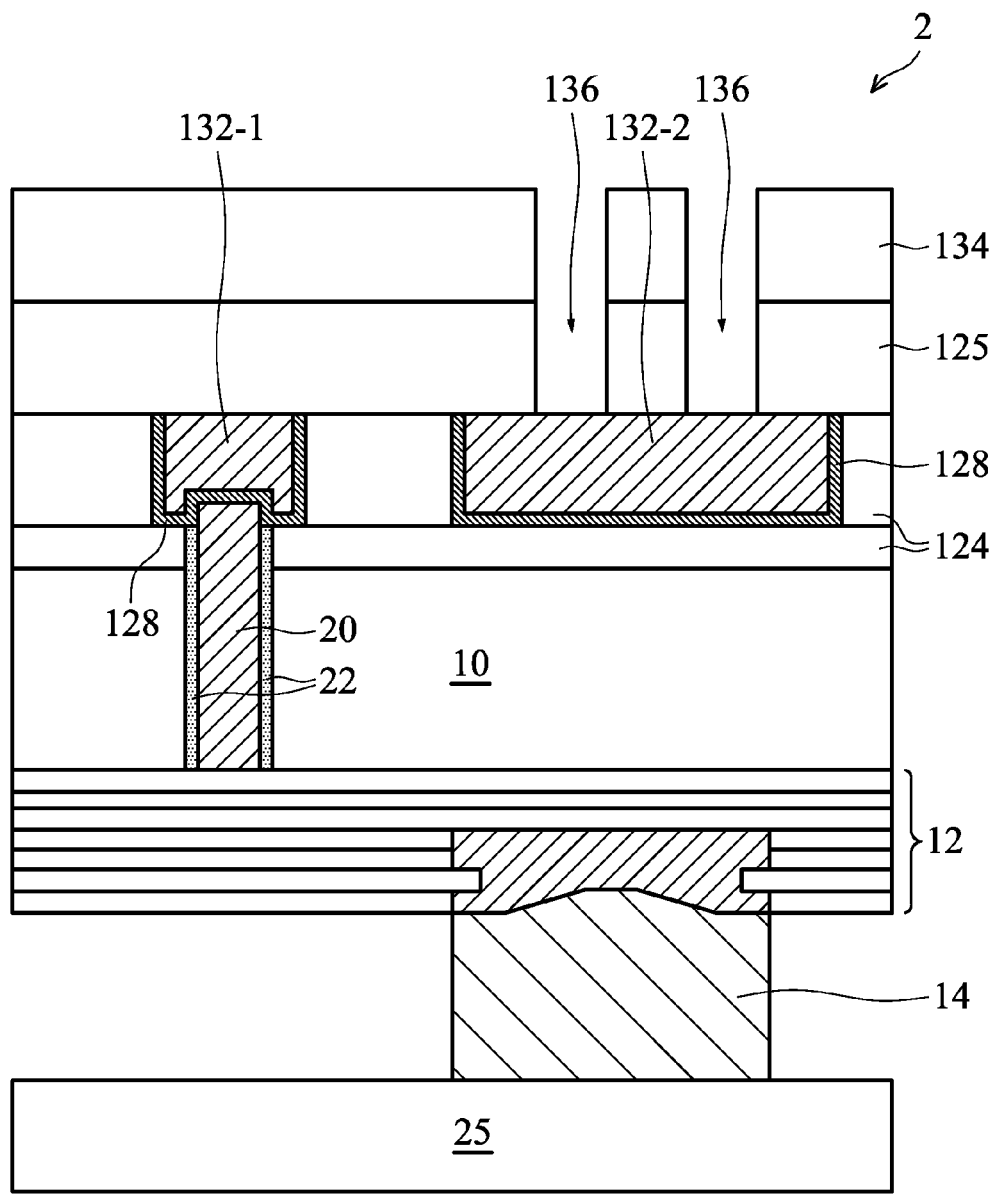

FIGS. 18 through 21 illustrate the formation of an additional layer of interconnect. Referring to FIG. 18, dielectric layer 125 is formed. In an embodiment, dielectric layer 125 is formed of polyimide, which may have a thickness of several microns such as about 2.5 μm. Photo resist 134 is then applied and patterned. Via openings 136 are then formed by etching dielectric layer 125 through patterned photo resist 134, until metal line 132-2 is exposed.

Figure 19:
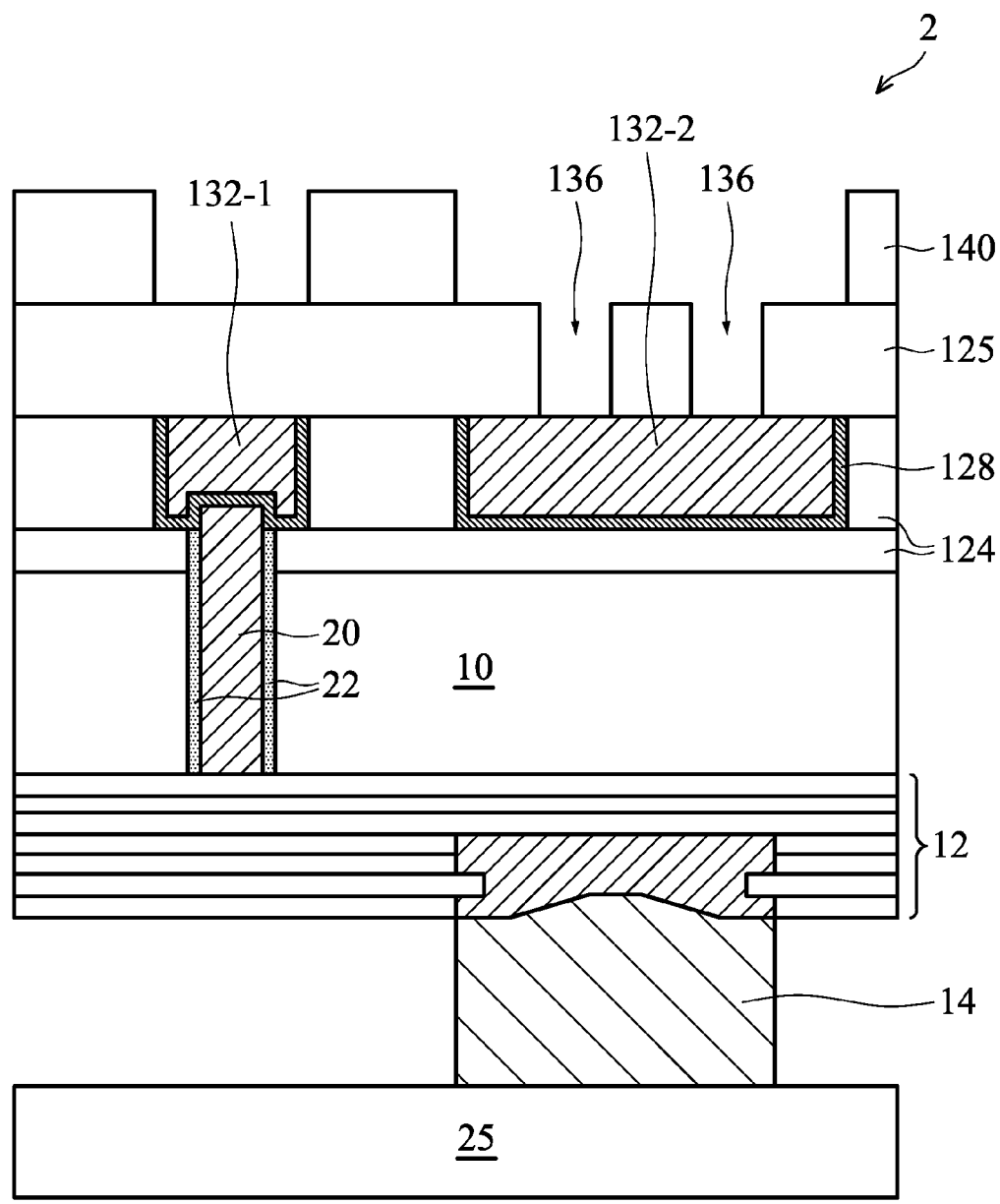
Figure 20:
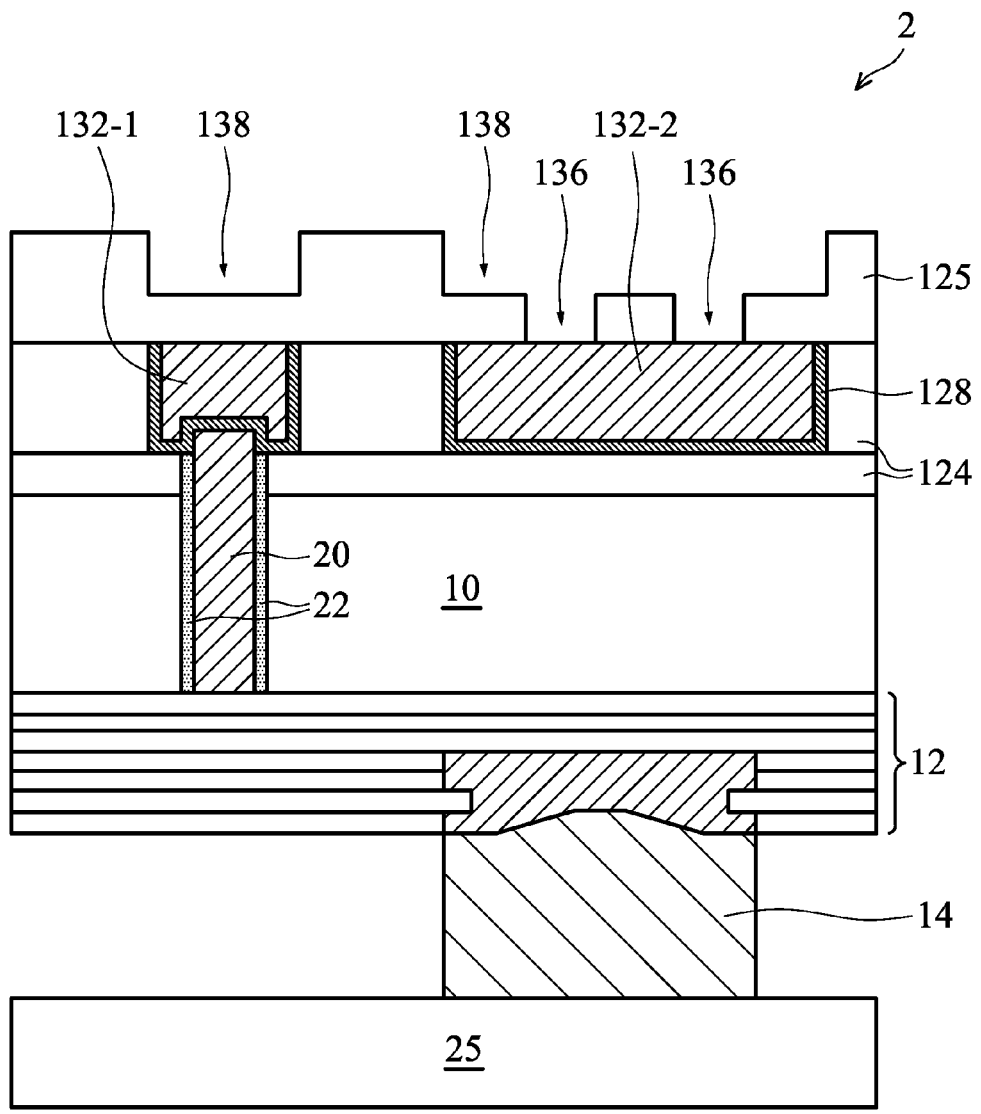

Referring to FIG. 19, photo resist 134 is removed, and an additional photo resist 140 is formed and patterned. Trench openings 138 are then formed by further etching dielectric layer 125 through patterned photo resist 140, as illustrated in FIG. 20. The etching may be performed using a time mode, so that the etching is stopped at an intermediate level of dielectric layer 125. Photo resist 140 is then removed, for example, by ashing. It is realized that the steps shown in FIGS. 18 through 20 are a via-first approach, in which via openings 136 are formed before the formation of trench openings 138. One skilled in the art will realize that the structure shown in FIG. 20 may be formed using a trench-first approach, in which the steps shown in FIGS. 19 and 20 may be performed before the step shown in FIG. 18.

Figure 21:
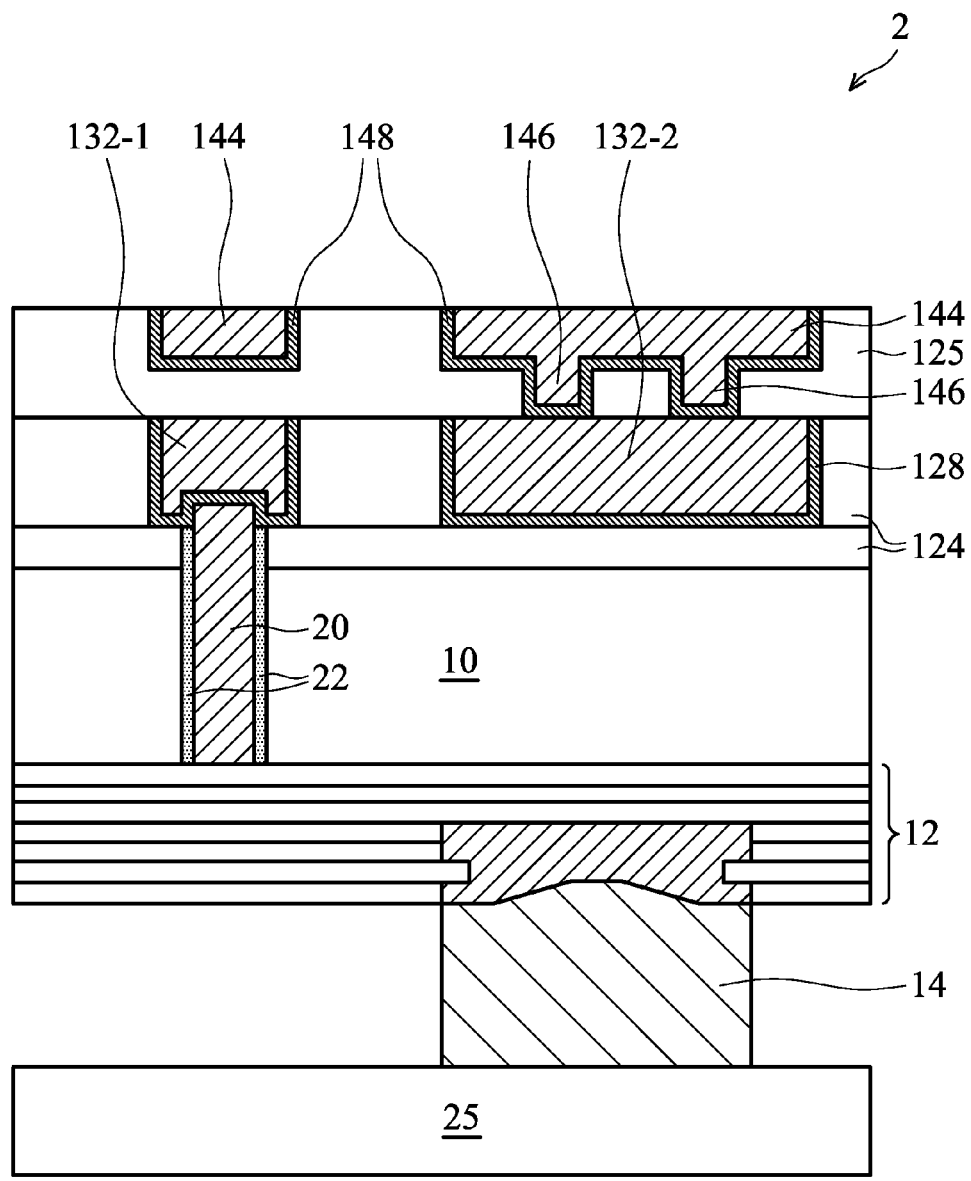
Figure 22:
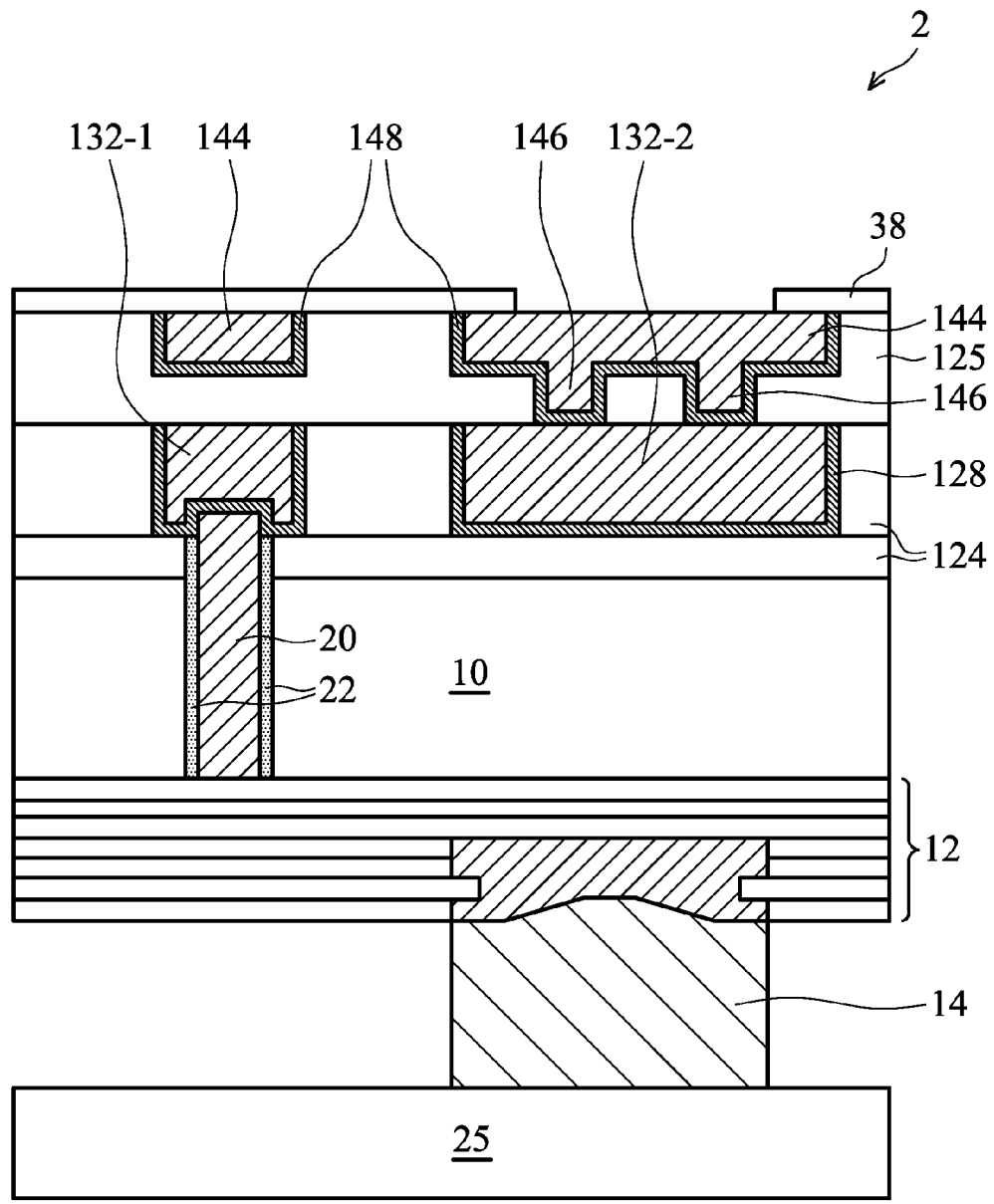
Figure 23A:
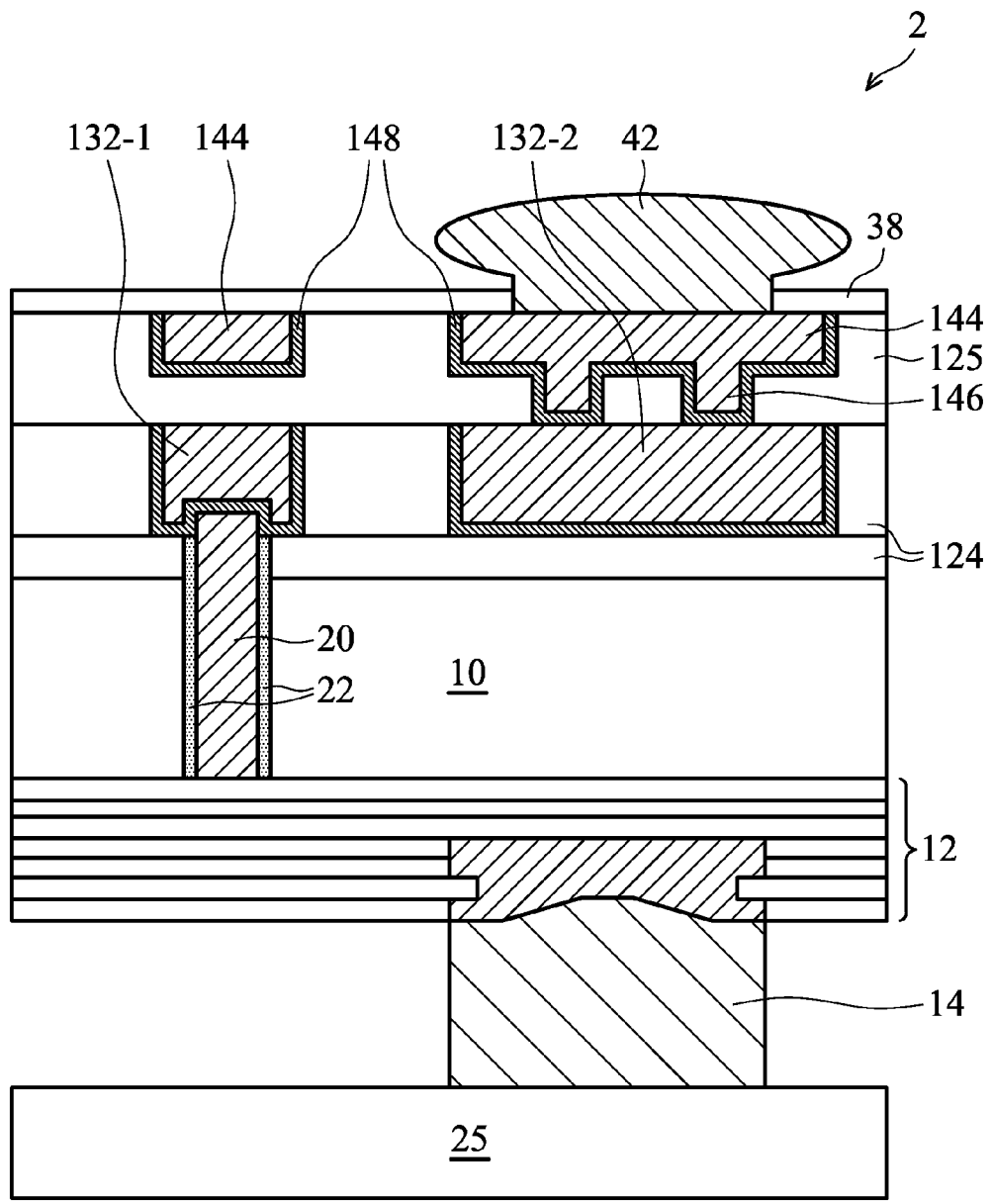
Figure 23B:
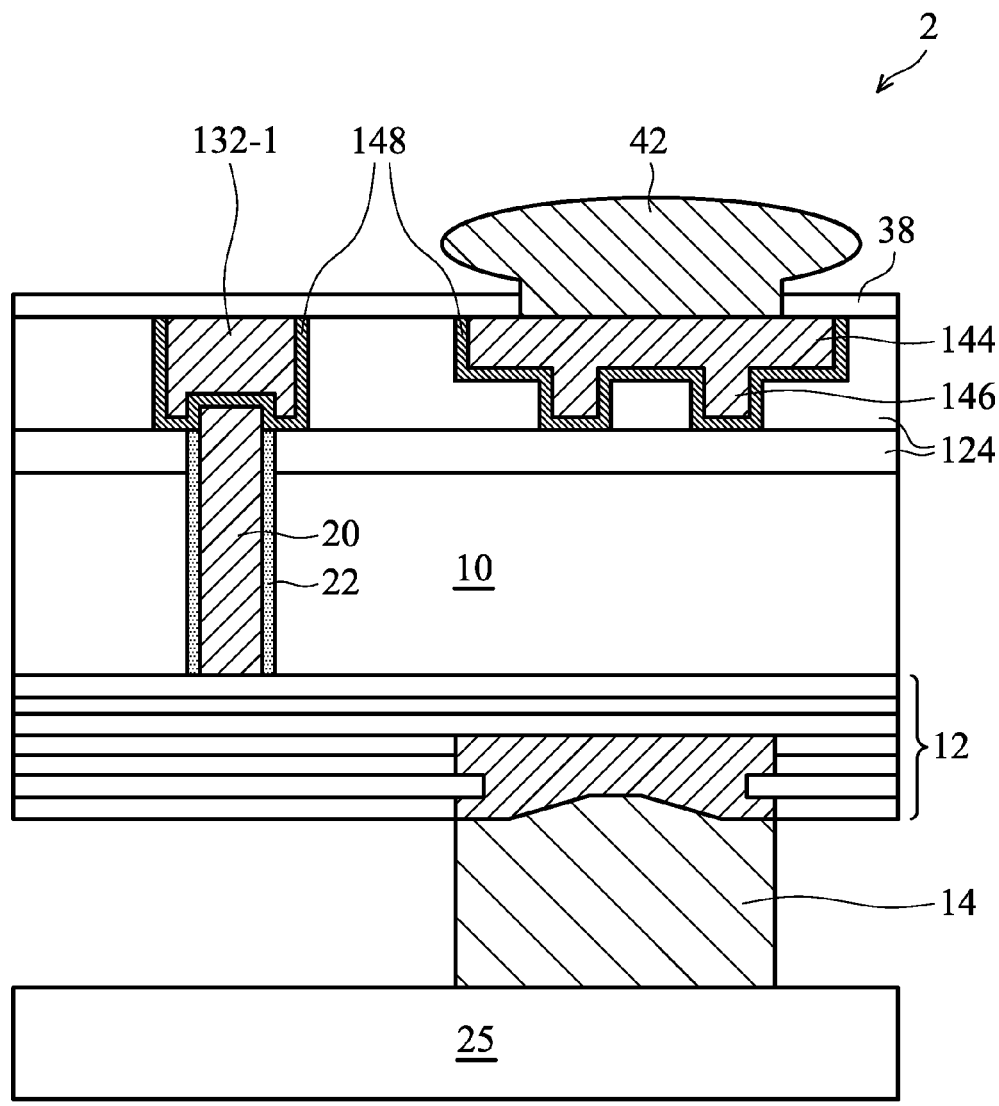

FIG. 21 illustrates the formation of damascene structures including metal lines 144 and vias 146, which may include depositing conductive barrier layer 148 (for example, a Ti layer), plating copper, and performing a CMP to remove excess copper. FIGS. 22 through 23A illustrate the formation of dielectric layer 40 and bump 42. The formation processes may be essentially the same as described in the preceding embodiment, and hence are not repeated herein. FIG. 23B illustrates an alternative embodiment, wherein metal lines 144 and vias 146 are formed in dielectric layer 124.

Figure 24:
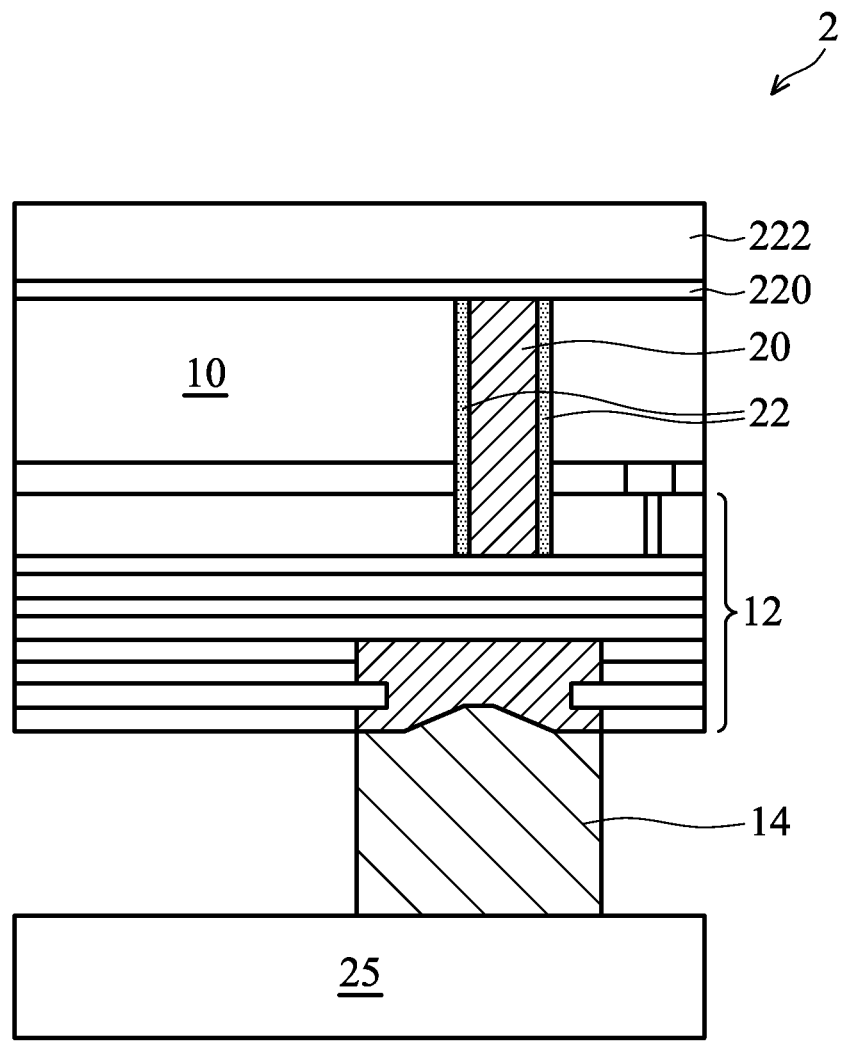
FIGS. 24 through 29B illustrate cross-sectional views of intermediate stages in the manufacturing of a backside interconnect structure in accordance with yet another embodiment, in which the backside interconnect are formed on the back surface of a substrate.

FIGS. 24 through 29B illustrate yet another embodiment. The initial steps of this embodiment are the same as shown in FIGS. 1 and 2. Next, as shown in FIG. 24, etch stop layer 220 is formed. In an embodiment, etch stop layer 220 is formed of silicon nitride, and may have a thickness, for example, of about 750 Å. Dielectric layer 222 is then formed on etch stop layer 220. In an embodiment, dielectric layer 222 is formed using one of various chemical vapor deposition (CVD) methods, and may comprise, for example, an oxide. The thickness of the CVD dielectric layer 222 may be, for example, about 8 KÅ. In alternative embodiments, dielectric layer 222 may be formed of polyimide, and hence may have a significantly greater thickness than what is formed using CVD. The thickness of dielectric layer 222 formed of polyimide may be greater than about 2 μm, and may be about 5 μm in an exemplary embodiment.

Figure 25:
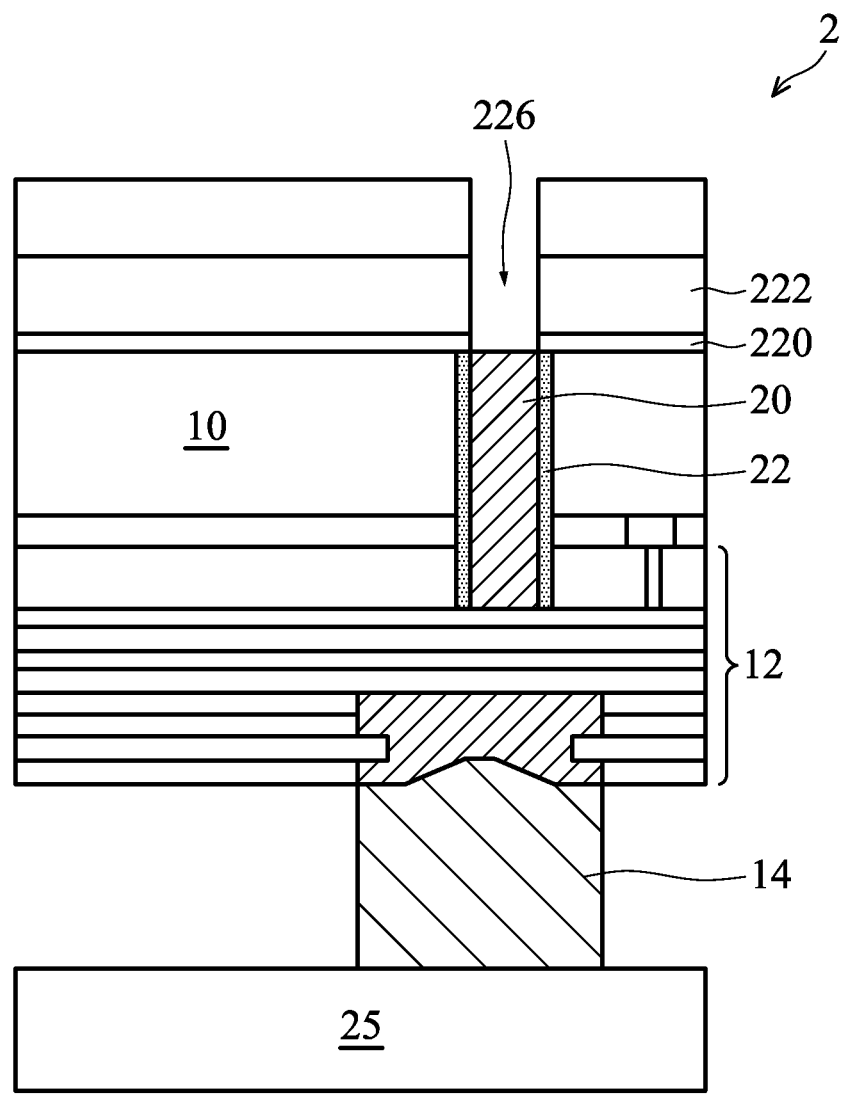
Figure 26:
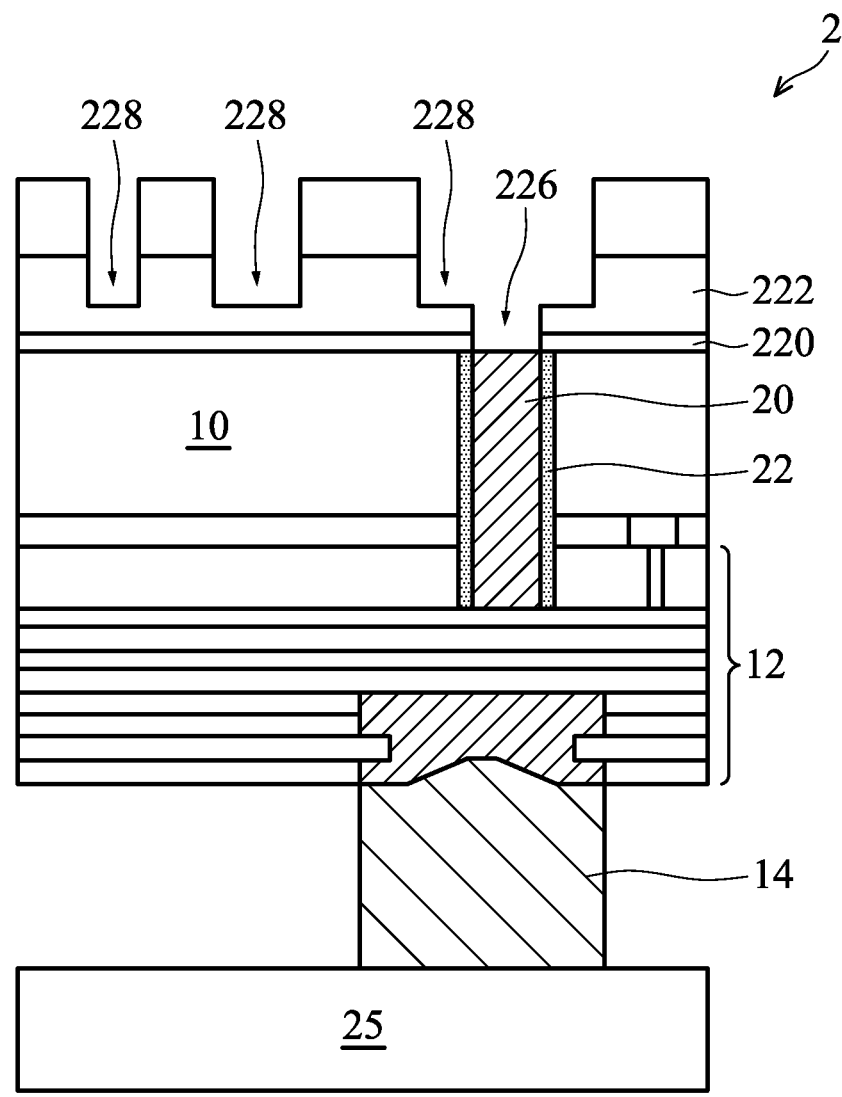
Figure 27:
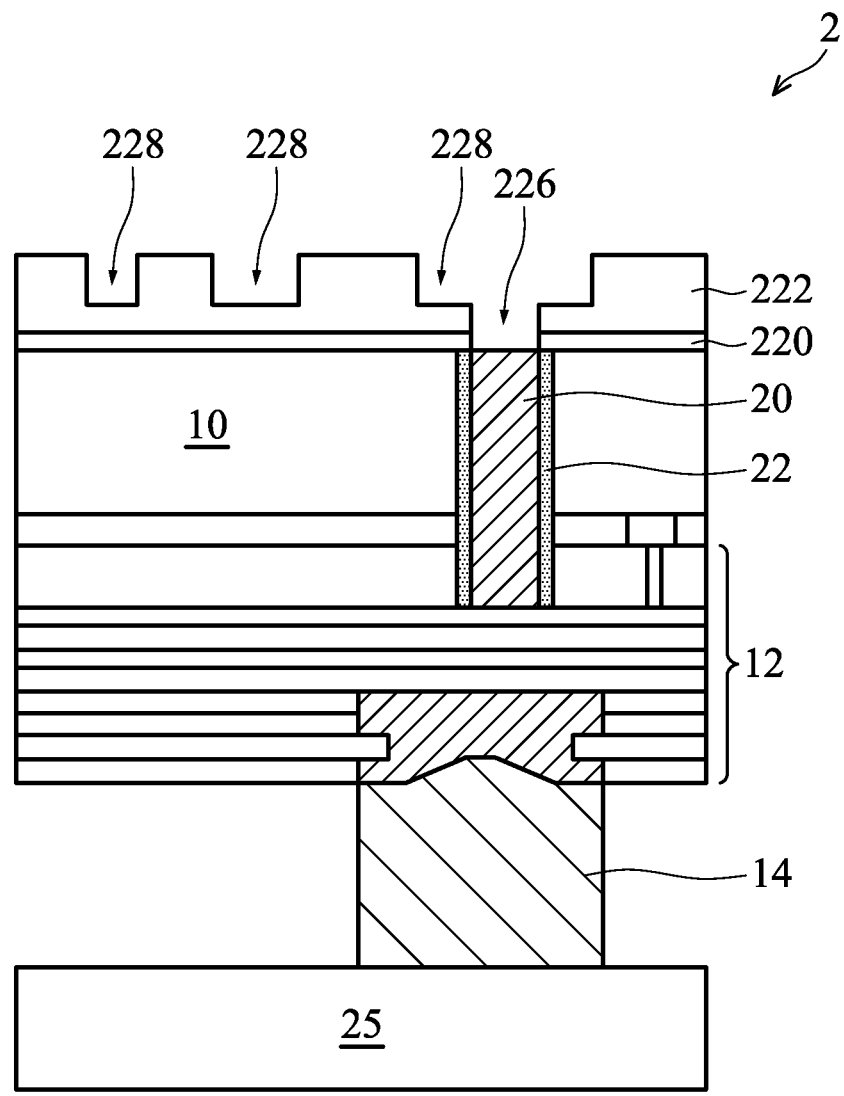
Figure 28:
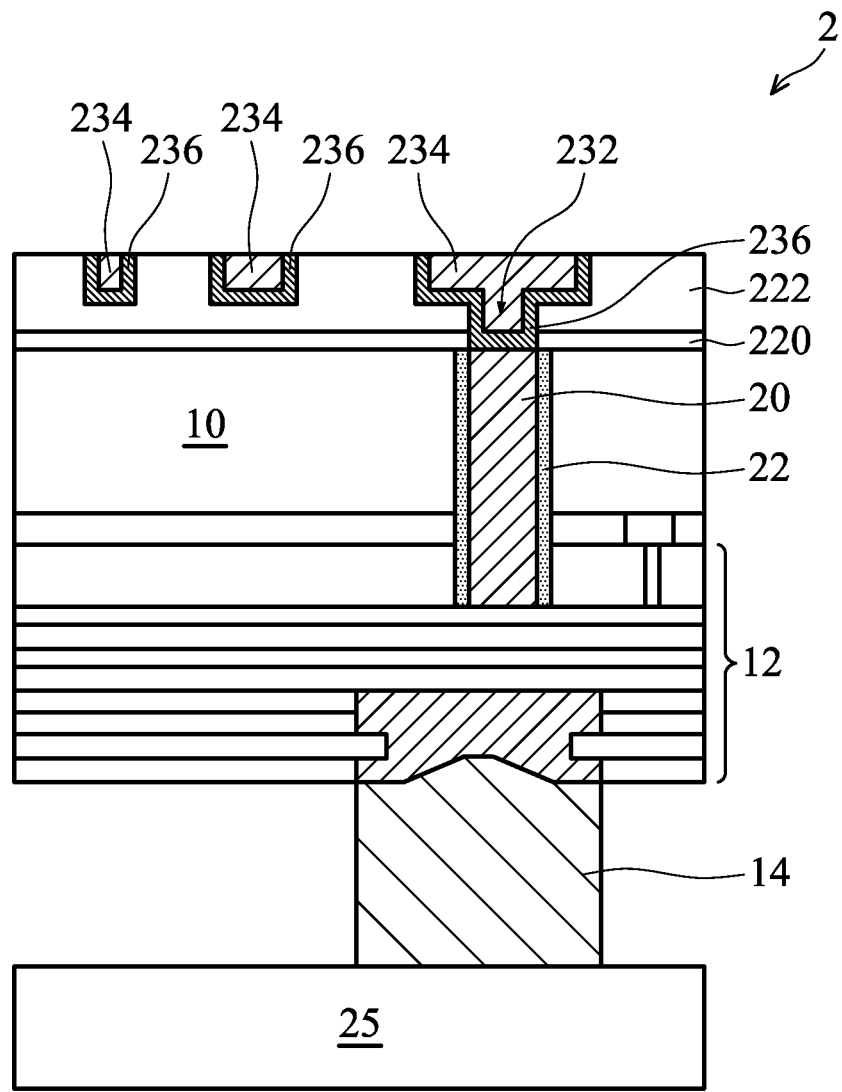

FIGS. 25 through 27 illustrate the formation of via opening 226 and trench openings 228. The formation details are essentially the same as illustrated in FIGS. 18 through 20, and hence are not repeated herein. Next, as shown in FIG. 28, a dual damascene structure including vias 232 and overlying metal lines 234, which may be formed of copper, are formed. Conductive barrier layers 236 are also formed.

Figure 29A:
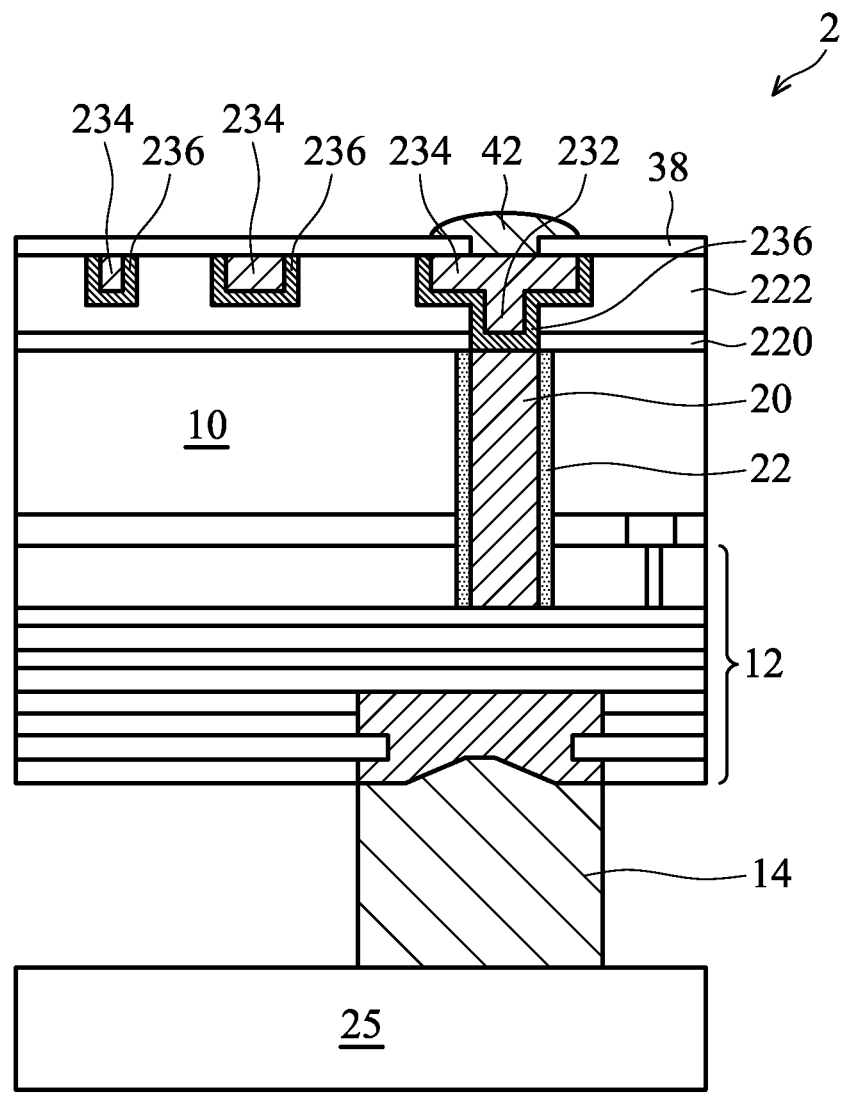
Figure 29B:
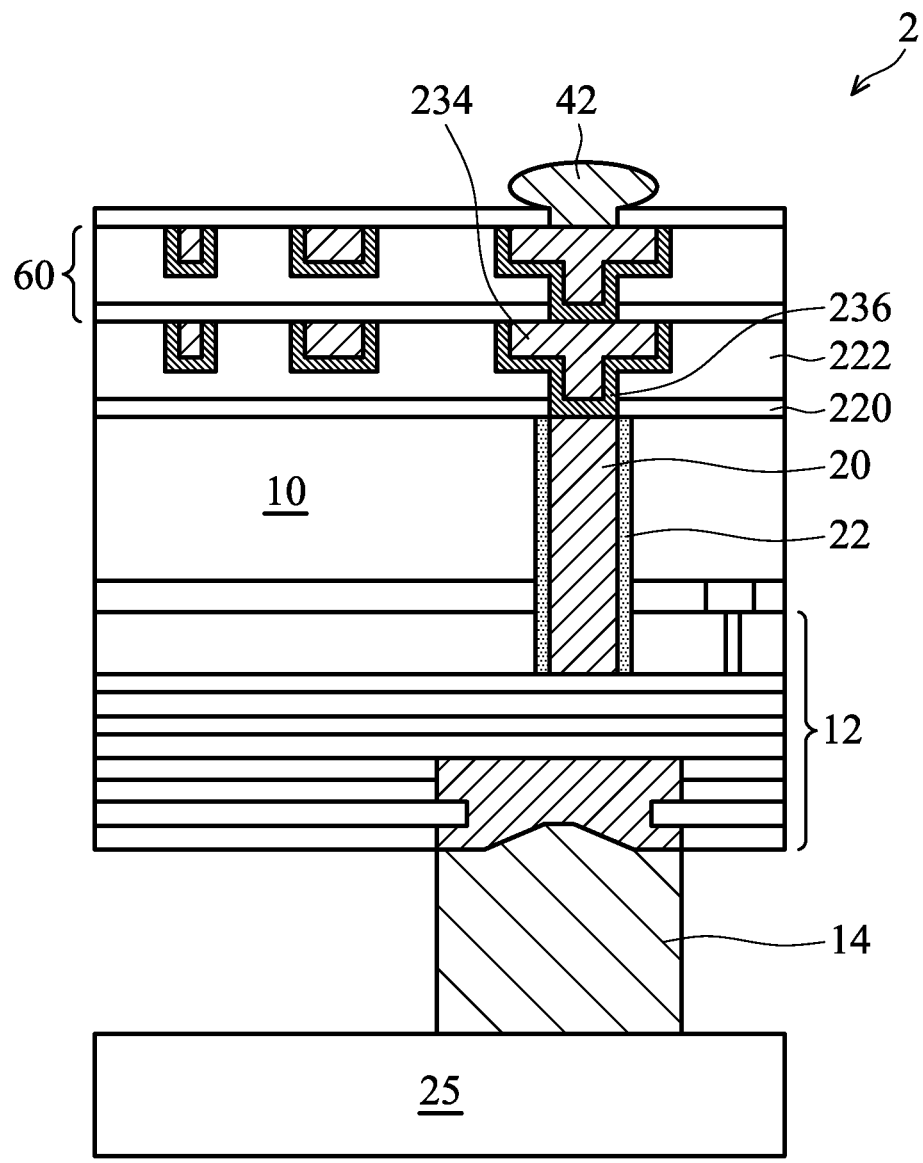

FIG. 29A illustrates the formation of dielectric layer 40 and bump 42. The materials and the formation processes of dielectric layer 40 and bump 42 may be essentially the same as illustrated in FIGS. 10-12A. FIG. 29B illustrates an alternative embodiment with an additional layer of interconnection (60), which includes additional dual damascene structures. If necessary, more interconnection layers may be inserted.

The embodiments have several advantageous features. By forming backside interconnect structures using dual damascene processes, multiple interconnect layers may be stacked to provide a great routing ability. By recessing substrates to form metal pads (36-2 in FIGS. 10 and 132-1 in FIG. 17) to contact TSVs, the metal pads may have great sizes, so that the accuracy requirement in the alignment of the metal pads to TSVs is relaxed. Further, the metal pads and the underlying TSVs have large contact areas, and hence the contact resistances are reduced.

Although the embodiments and their advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. An integrated circuit structure comprising:
   a semiconductor substrate having a front surface and a back surface opposite the front surface;
   a conductive via in the semiconductor substrate;
   a first metal feature extending from the back surface of the semiconductor substrate into the semiconductor substrate and contacting the conductive via, wherein a surface of the first metal feature opposite the conductive via is substantially level with the back surface of the semiconductor substrate, wherein the conductive via is disposed between the first metal feature and the front surface of the semiconductor substrate in a plane, wherein the plane is perpendicular to the front surface of the semiconductor substrate;
   a bump overlying and electrically connected to the first metal feature; and
   a second metal feature formed between the first metal feature and the bump, wherein the second metal feature comprises a dual damascene structure.

2. The integrated circuit structure of claim 1, further comprising a dielectric layer on the back surface of the semiconductor substrate, wherein the second metal feature is disposed in the dielectric layer.

3. The integrated circuit structure of claim 1, wherein all horizontal dimensions of the first metal feature are greater than respective horizontal dimensions of the conductive via.

4. The integrated circuit structure of claim 1, wherein the first metal feature comprises:

a conductive barrier layer contacting the conductive via; and a copper-containing metallic material over the conductive barrier layer.

5. The integrated circuit structure of claim 1 further comprising an active device at the front surface of the semiconductor substrate, and wherein the back surface is opposite the front surface of the semiconductor substrate.

6. The integrated circuit structure of claim 1, further comprising an additional metal feature extending from the back surface of the semiconductor substrate into the semiconductor substrate, wherein the additional metal feature does not extend through the semiconductor substrate.

7. An integrated circuit structure comprising:
a semiconductor substrate;
an active device on a front surface of the semiconductor substrate;
a through-substrate via (TSV) extending at least partially through the semiconductor substrate;
a first metal feature at a back surface of the semiconductor substrate and electrically connected to the TSV, wherein all horizontal dimensions of the first metal feature are greater than respective horizontal dimensions of the TSV, and wherein the back surface is opposite the front surface of the semiconductor substrate, wherein a surface of the first metal feature opposite the TSV is substantially level with the back surface of the semiconductor substrate; and
a second metal feature on the back surface of the semiconductor substrate, wherein the second metal feature comprises a dual damascene structure.

8. The integrated circuit structure of claim 7, wherein the first metal feature extends from the back surface of the semiconductor substrate into the semiconductor substrate.

9. The integrated circuit structure of claim 7, further comprising a metal line in the semiconductor substrate.

10. The integrated circuit structure of claim 7, further comprising a bump electrically connected to the first metal feature.

11. The integrated circuit structure of claim 7, wherein the second metal feature contacts a top surface of the first metal feature.

12. The integrated circuit structure of claim 7, wherein the second metal feature is disposed in a dielectric layer, and wherein the integrated circuit structure further comprises an etch stop layer disposed between the semiconductor substrate and the dielectric layer.

13. An integrated circuit structure comprising:
a semiconductor substrate comprising an active device at a front surface of the semiconductor substrate;
an interconnect structure at the front surface of the semiconductor substrate;
a conductive via in the semiconductor substrate;
a first metal feature in the semiconductor substrate and electrically connected to the conductive via, wherein the first metal feature extends from a back surface of the semiconductor substrate into the semiconductor substrate, wherein the back surface is opposite the front surface of the semiconductor substrate;
a second metal feature adjacent the first metal feature extending from the back surface of the semiconductor substrate into the semiconductor substrate, wherein the second metal feature is a redistribution line, wherein the second metal feature is disposed outside of a region of the semiconductor substrate, wherein the region of the semiconductor substrate is bounded by a first line extending along a first sidewall of the conductive via and a second line extending along a second sidewall of the conductive via opposite the first sidewall, and wherein a portion of the semiconductor substrate is disposed between the first metal feature and the second metal feature; and
a third metal feature on the first metal feature, wherein the third metal feature comprises a dual damascene structure.

14. The integrated circuit structure of claim 13, wherein the conductive via extends at least partially through the interconnect structure.

15. The integrated circuit structure of claim 13 further comprising a bump on the first metal feature.

16. The integrated circuit structure of claim 1 further comprising a redistribution line extending from the back surface of the semiconductor substrate into the semiconductor substrate.

17. The integrated circuit structure of claim 16 wherein lateral surfaces of the redistribution line and the first metal feature are substantially level.

18. The integrated circuit structure of claim 1, wherein a transistor is disposed at the front surface of the semiconductor substrate.

* * * * *